(12) United States Patent
Mort

(10) Patent No.: US 11,456,729 B1
(45) Date of Patent: Sep. 27, 2022

(54) DESKEW CELL FOR DELAY AND PULSE WIDTH ADJUSTMENT

(71) Applicant: Analog Devices, Inc., Wilmington, MA (US)

(72) Inventor: Andrew Nathan Mort, Wexford, PA (US)

(73) Assignee: Analog Devices, Inc., Wilmington, MA (US)

( * ) Notice: Subject to any disclaimer, the term of this patent is extended or adjusted under 35 U.S.C. 154(b) by 55 days.

(21) Appl. No.: 17/214,566

(22) Filed: Mar. 26, 2021

(51) Int. Cl.
| | |
|---|---|
| *H03K 5/01* | (2006.01) |
| *G01R 31/317* | (2006.01) |
| *H03K 3/017* | (2006.01) |
| *H03K 5/00* | (2006.01) |

(52) U.S. Cl.
CPC ......... *H03K 5/01* (2013.01); *G01R 31/31727* (2013.01); *H03K 3/017* (2013.01); *H03K 2005/00019* (2013.01)

(58) Field of Classification Search
CPC ..................... H03K 5/01; H03K 3/017; H03K 2005/00019; G01R 31/31727
USPC ..................................................... 324/762.01
See application file for complete search history.

(56) References Cited

U.S. PATENT DOCUMENTS

| | | | | |
|---|---|---|---|---|
| 5,355,037 A | * | 10/1994 | Andresen | G06F 1/10 327/158 |
| 5,420,546 A | * | 5/1995 | Watanabe | H03L 7/0996 331/25 |
| 5,544,203 A | * | 8/1996 | Casasanta | G06F 1/10 375/376 |
| 5,996,102 A | | 11/1999 | Haulin | |
| 6,060,920 A | * | 5/2000 | Saeki | H03K 5/133 327/152 |
| 6,177,846 B1 | * | 1/2001 | Takada | H03K 3/0315 331/74 |
| 6,292,412 B1 | | 9/2001 | Kato et al. | |
| 6,393,080 B1 | | 5/2002 | Kamoshida et al. | |
| 6,449,727 B1 | * | 9/2002 | Toda | G11C 7/22 713/401 |
| 6,462,598 B1 | | 10/2002 | Okayasu et al. | |
| 6,486,723 B1 | * | 11/2002 | DeRyckere | H03K 5/135 327/276 |

(Continued)

FOREIGN PATENT DOCUMENTS

| | | |
|---|---|---|
| CN | 109617541 A | 4/2019 |
| JP | 2002100966 A | 4/2002 |
| JP | 5617688 B2 | 9/2014 |

*Primary Examiner* — Ryan Jager
(74) *Attorney, Agent, or Firm* — Schwegman Lundberg & Woessner, P.A.

(57) ABSTRACT

A deskew system can be used to adjust signal characteristics such as pulse width and edge timing. In an example, a deskew system can include multiple timing control cells and each cell can operate in one of multiple different modes according to respective mode control signals. The modes can include at least a signal delay mode and a signal pulse width adjustment mode. In an example, a first cell in a deskew system can be configured to receive a test input signal at a first input node and, in response, provide a deskew output signal at a first output node. The deskew output signal can be based on the test input signal, a pulse width adjustment provided by the first cell, and on a delayed signal, corresponding to the input signal, that is provided by a subsequent cell in the series.

20 Claims, 13 Drawing Sheets

(56) References Cited

U.S. PATENT DOCUMENTS

| | | | |
|---|---|---|---|
| 6,617,894 B2* | 9/2003 | Yoon | G06F 1/10 |
| | | | 327/161 |
| 7,076,012 B2 | 7/2006 | Dermott et al. | |
| 7,423,465 B2 | 9/2008 | Gomm | |
| 7,456,665 B2* | 11/2008 | Hinz | H03K 5/133 |
| | | | 327/158 |
| 7,460,969 B2 | 12/2008 | Suda et al. | |
| 7,609,043 B2 | 10/2009 | Sutardja et al. | |
| 7,652,512 B2* | 1/2010 | Ho | H03K 5/135 |
| | | | 327/161 |
| 7,663,945 B2 | 2/2010 | Takahashi et al. | |
| 7,668,037 B2 | 2/2010 | Carpenter et al. | |
| 7,701,801 B2 | 4/2010 | Joshi et al. | |
| 7,800,437 B2 | 9/2010 | Khoury et al. | |
| 8,207,773 B2 | 6/2012 | Crofts | |
| 10,063,222 B1 | 8/2018 | Arp et al. | |
| 2001/0002799 A1* | 6/2001 | Saeki | G06F 1/10 |
| | | | 327/292 |
| 2003/0007414 A1* | 1/2003 | Kato | H03K 5/135 |
| | | | 365/233.1 |
| 2005/0225371 A1 | 10/2005 | Kim et al. | |
| 2006/0261869 A1 | 11/2006 | Gomm et al. | |
| 2009/0309638 A1* | 12/2009 | Delage | H03L 7/0814 |
| | | | 327/158 |
| 2014/0293713 A1 | 10/2014 | Gomm et al. | |

\* cited by examiner

US 11,456,729 B1

DESKEW CELL FOR DELAY AND PULSE WIDTH ADJUSTMENT

BACKGROUND

A test system for electronic device testing can include a pin driver circuit that provides a voltage test pulse or current test pulse to a device under test (DUT). In response, the test system can be configured to measure a response from a DUT, such as to determine whether the DUT meets one or more specified operating criteria.

In an example, test systems can include dynamic controls for delivering timing signals, including controls for synchronizing or deskewing multiple signals to be provided to, or received from, a DUT. The timing signals can be used to perform tests on a variety of integrated circuit devices. In each test, timing signals can be applied to respective pins of a DUT, and corresponding response signals can be analyzed. The timing signals may travel to each DUT pin by a different path, and response signals from the DUT can similarly travel different paths to response analysis circuitry. Such differences in propagation paths, or other influences on signal timing or propagation, can influence test results. Various techniques can be used to correct, or to more precisely control, the timing of test signals that are desired to arrive at a DUT at precise times or in synchronization.

Timing errors are generally referred to herein as "skew." In an early approach to deskewing signals, a number of manually adjustable potentiometers were associated with each pin for aligning in time each pin's input signal. The potentiometers could be adjusted whenever the system required recalibration. In another approach, a deskewing system can include a sequence of stages for delaying a signal. A more coarse stage can delay a signal by multiples of a predetermined delay interval and a finer stage can provide for finer adjustment of the delay interval.

BRIEF SUMMARY

The present inventor has recognized, among other things, that a problem to be solved includes providing a test system that can synchronize timing signals, or adjust edge placement or pulse width characteristics of stimulus signals, and thereby reduce or eliminate timing errors at a device under test (DUT).

In an example, a solution to the above-described problems can include or use a deskew system for providing a programmable delay. The deskew system can be configured to change an edge timing or other characteristic of test signals provided to a device under test. The deskew system can include multiple timing control cells coupled in a series. A particular cell of the multiple timing control cells can include a first input node and a first output node, and the cell can be configured to delay and/or adjust a pulse width of an input signal received at the first input node. The particular cell can further include an early signal input node coupled to a forward output node of a preceding cell in the series or to the first input node, and a late signal input node coupled to a reverse output node of a subsequent cell in the series. The particular cell can further include a summing circuit configured to provide an intermediate signal by combining signals that are modulated based on a delay component of a cell control code and respective data signals at the early and late signal input nodes. The particular cell can further include a pulse width adjustment circuit configured to provide a pulse width-adjusted output signal at the first output node based on a pulse width component of the cell control code and the intermediate signal from the summing circuit.

In an example, a solution to the above-described problems can additionally or alternatively include or use a method for providing a programmable delay signal or programmable pulse width adjusted signal. The method can include, among other things, using multiple, series-coupled signal timing control cells wherein each of the control cells operates in a pulse width adjustment mode, a delay mode, or a pulse width adjustment and delay mode. The method can include, at a first cell of the timing-control cells, receiving an input test signal at an input node of the first cell, receiving a cell control code, providing a first delayed signal, based on the input test signal, to a subsequent cell of the series-coupled timing-control cells, receiving, at the first cell, a second delayed signal from the subsequent cell, and providing a pulse width-adjusted output signal based on the second delayed signal. In this example, a delay characteristic and a pulse width characteristics of the output signal can be based on information in the cell control code.

This Summary is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A pin driver circuit of a test system, such as an Automated Test Equipment (ATE) system, can provide a voltage pulse stimulus to a device under test (DUT) at a specified time, and, optionally, a comparator circuit can measure a response from the DUT. The test system can be configured to provide high fidelity output signal pulses over a relatively large output signal magnitude range to accommodate different types of devices under test. In an example, an ATE system can include multiple test channels that can operate substantially independently and in parallel, such as to provide multiple test signals to the same DUT or to different DUTs concurrently.

Automated test equipment systems are generally configured to perform tests and determine whether a DUT meets one or more performance specifications. Precise and reproducible test signals, or vectors, can be provided by an ATE system to determine whether a particular DUT complies with a specified timing or response specification.

An ATE system can be characterized in part by its edge placement accuracy. Edge placement can refer to a fidelity or an accuracy characteristic of a signal, and it can help quantify the precision and repeatability of test signals provided by the system to a DUT. As more channels are added to a single system or die there can be a corresponding need to compensate for differences in circuit board traces, transmission signal length, parasitic loading effects, and other physical characteristics that can influence test signal behavior. These differences between channels can cause timing errors, such as between signals provided at different pins on a DUT. In an example, a programmable test signal deskew cell, also known as a deskew circuit or timing vernier, can be used to help synchronize vector timing, such as in terms of signal edge placement, pulse width, or other signal morphology characteristic, and thereby reduce or eliminate timing errors at a DUT. In an example, the programmable test signal deskew cell or cells can be provided for each of multiple channels in a system.

Figure 1A:
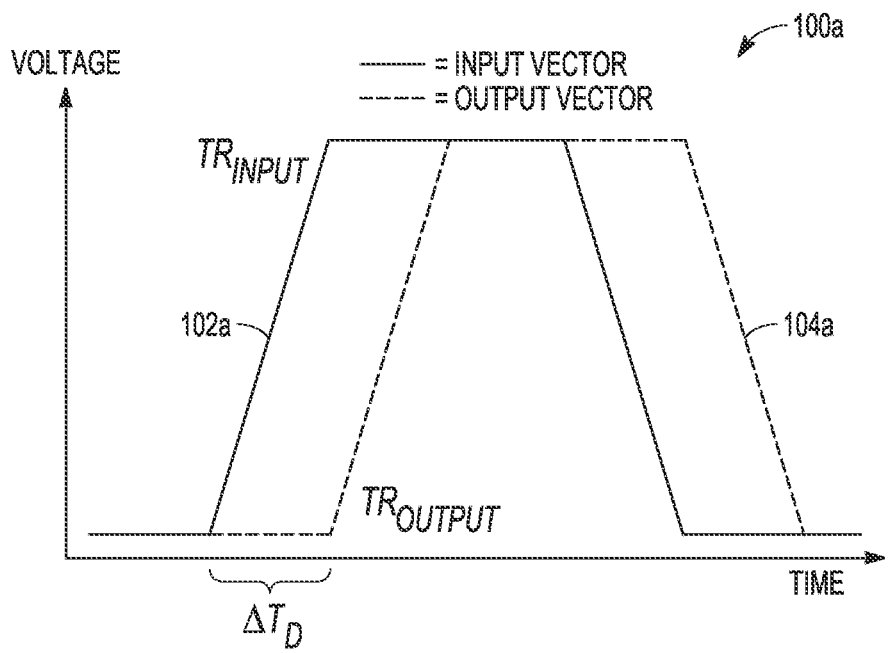
FIG. 1A illustrates generally an example of an output signal as a delayed version of an input signal.

FIG. 1A illustrates generally an example of an output signal as a delayed version of an input signal. FIG. 1A includes a first delay example 100a that shows a result of using a delay deskew circuit to delay an input signal in time. The first delay example 100a includes a first input signal vector 102a and a first output signal vector 104a. The delay deskew circuit can receive the first input signal vector 102a at an input node and provide the first output signal vector 104a as a delayed version of the first input signal vector 102a. Under ideal conditions, the delay deskew circuit delays the first input signal vector 102a by a precise, adjustable amount without altering signal fidelity, morphology (e.g., corresponding to a waveform shape), or bandwidth, to provide the first output signal vector 104a as a replica of the first input signal vector 102a, except for a shift in time.

The example of FIG. 1A demonstrates no bandwidth limitation when the input signal rise time $TR_{input}$ (e.g., corresponding to the first input signal vector 102a) matches the output signal rise time $TR_{output}$ (e.g., corresponding to the first output signal vector 104a). The magnitude of the delay duration $\Delta T_D$ can be specified by a Delay Adjust Code, such as can include a digital or analog control signal input to a deskew circuit controller.

Figure 1B:
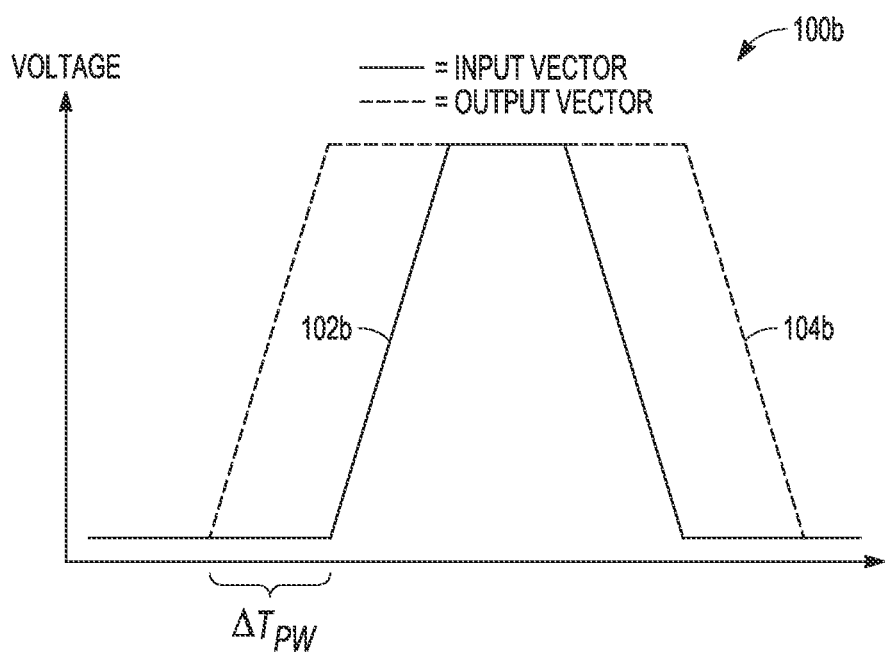
FIG. 1B illustrates generally an example of an output signal as a pulse width adjusted version of an input signal.

FIG. 1B illustrates generally an example of an output signal as a pulse width-adjusted version of an input signal. FIG. 1B includes a first pulse width example 100b that shows a result of using a pulse width deskew circuit to adjust a pulse width characteristic of an input signal. The first pulse width example 100b includes a second input signal vector 102b and a second output signal vector 104b. For purposes of illustration, the second input signal vector 102b and the second output signal vector 104b are overlaid in the example of FIG. 1B to more clearly show the pulse width difference between the input and output signals. The pulse width deskew circuit can receive the second input signal vector 102b at an input node and provide the second output signal vector 104b as a pulse width-adjusted version of the second input signal vector 102b. Under ideal conditions, the pulse width deskew circuit adjusts a pulse width of the second input signal vector 102b by a precise, adjustable amount without otherwise altering signal fidelity, morphology, or magnitude, to provide the second output signal vector 104b as a replica of the second input signal vector 102b pulse, except for a dilation or contraction in a duration of the pulse. In an example, a magnitude of the pulse width adjustment $\Delta T_{PW}$ can be specified by a Pulse Width Adjust Code, such as can include a digital or analog control signal input to a deskew circuit controller.

Figure 2A:
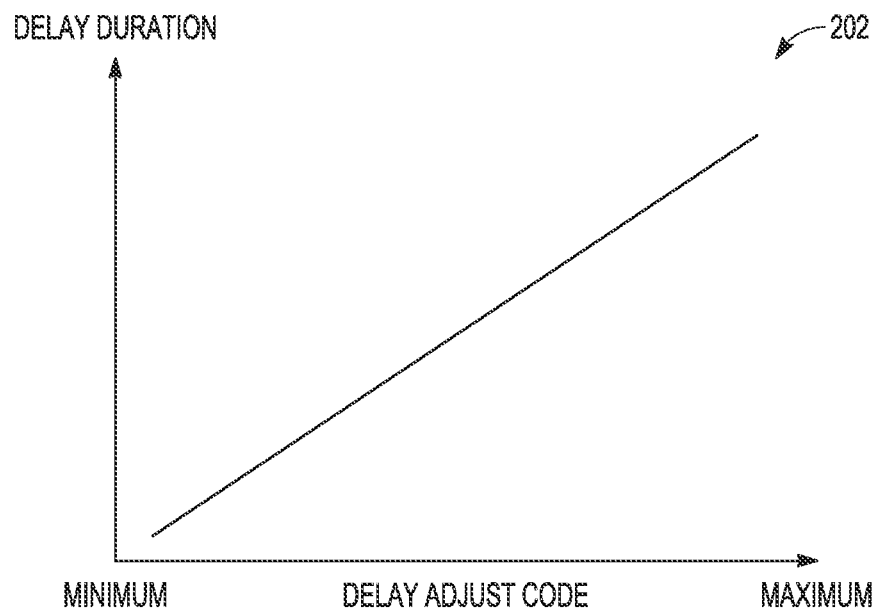
FIG. 2A illustrates generally a relationship between a Delay Adjust Code and a signal delay magnitude.
Figure 2B:
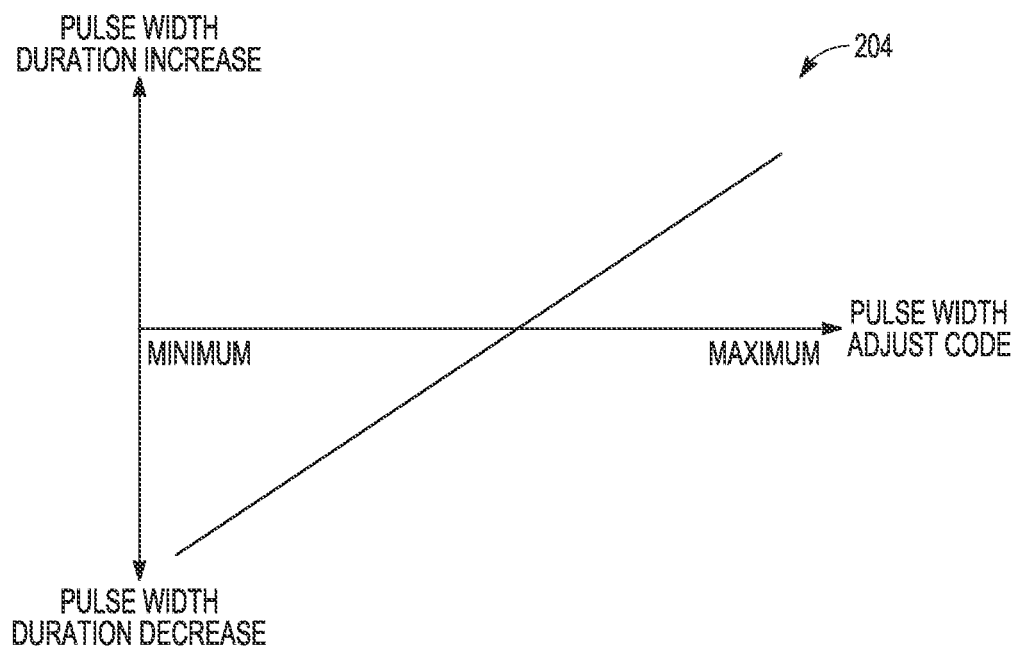
FIG. 2B illustrates generally a relationship between a Pulse Width Adjust Code and a pulse width duration change.

FIG. 2A and FIG. 2B illustrate generally examples of different skew adjust charts. The charts show a relationship between different skew control signals and respective signal changes. For example, FIG. 2A includes a first skew adjust chart 202 that shows a relationship between a Delay Adjust Code and a signal delay magnitude (e.g., corresponding to $\Delta T_D$ from the example of FIG. 1A). A Delay Adjust Code can include an analog or digital signal and can be provided to a deskew circuit to indicate an amount or magnitude of delay to apply to, e.g., the first input signal vector 102a in FIG. 1A. In the example, the Delay Adjust Code can be one of multiple different values ranging from [minimum] (e.g., zero delay) to [maximum] (e.g., a maximum amount of delay that can be provided by the deskew circuit). In the example of FIG. 2A, the line in the first skew adjust chart 202 indicates an ideal linear relationship between the Delay Adjust Code and the corresponding signal delay magnitude.

The example of FIG. 2B includes a second skew adjust chart 204 that shows a relationship between a Pulse Width Adjust Code and a pulse width duration change magnitude (e.g., corresponding to $\Delta T_{PW}$ from the example of FIG. 1B). A Pulse Width Adjust Code can include an analog or digital signal and can be provided to a deskew circuit to indicate an amount or magnitude of a pulse width adjustment to apply to, e.g., the second input signal vector 102b in FIG. 1B. In the example, the Pulse Width Adjust Code can be one of multiple different values ranging from [minimum] (e.g., a value indicating a maximum decrease in pulse width that can be provided by the deskew circuit) to [maximum] (e.g., a value indicating a maximum increase in pulse width that can be provided by the deskew circuit). In the example of FIG.

2B, the line in the second skew adjust chart 204 indicates an ideal linear relationship between the Pulse Width Adjust Code and the corresponding signal pulse width change magnitude.

Figure 3:
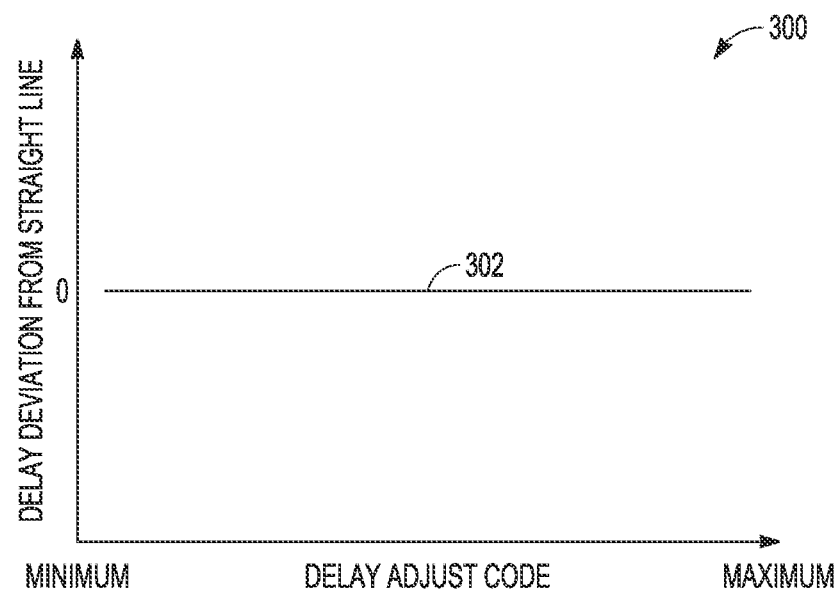
FIG. 3 illustrates generally a relationship between delay linearity error and a Delay Adjust Code.

FIG. 3 illustrates generally a third chart 300 showing a relationship between delay linearity error and a Delay Adjust Code. Delay linearity error is sometimes referred to as a Delay Deviation. In the example, an error line 302 demonstrates that there is no linearity error in the ideal deskew relationship shown in FIG. 2 by the first skew adjust chart 202. In other examples, the relationship can be non-linear, and in such case the error line 302 would deviate from a horizontal line. Generally, it is preferred to have a predictable and repeatable relationship between a Delay Adjust Code and resulting signal delay at the output. Non-linearity or unpredictability is undesirable because it can introduce edge placement uncertainty and thereby result in faulty or inconsistent measurement results. Linearity and predictability of a relationship between a Pulse Width Adjust Code and resulting signal pulse width adjustment at the output can be similarly important.

Figure 4:
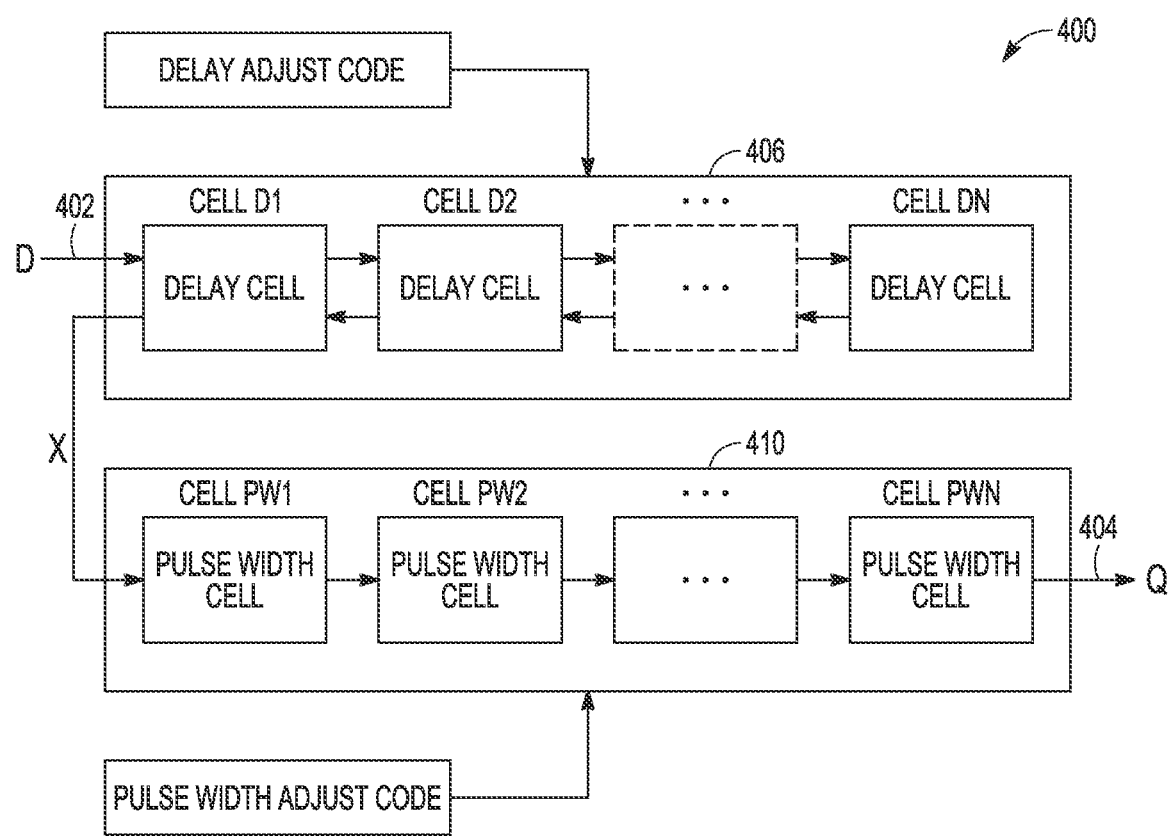
FIG. 4 illustrates generally an example of a first deskew system.

Various signal processing circuit topologies can be used to receive an input signal and provide an output signal that is deskewed relative to the input signal, such as in terms of delay or in terms of pulse width (e.g., pulse signal duration). FIG. 4 illustrates generally an example of a first signal processing circuit or first deskew system 400. The example of the first deskew system 400 includes a delay circuit 406 configured to receive an input signal D at a deskew input node 402 and, in response, provide an intermediate delayed signal X. The first deskew system 400 includes a pulse width adjust circuit 410 configured to receive the delayed signal X from the delay circuit 406 and, in response, provide a deskewed signal Q at an output signal node 404.

In an example, the delay circuit 406 comprises a cell-based topology. The delay circuit 406 can include an array or series of delay cells, Cell D1 through Cell DN, and each cell can be configured to apply the same or different delay to the input signal. The delay circuit 406 can be configured to receive a Delay Adjust Code, such as from a deskew controller, and the Delay Adjust Code can specify a magnitude of delay to be applied to an input signal, such as using one or more of the delay cells.

In an example, as few as zero or one of the delay cells in the delay circuit 406 can be used, such as to provide a minimum signal delay, or all of the delay cells in the delay circuit 406 can be used to provide a maximum signal delay. In an example, fewer than all of the cells in the delay circuit 406 can be used to provide an intermediate signal delay. FIG. 5A, FIG. 5B, FIG. 5C, FIG. 6, and FIG. 7 illustrate generally examples of the delay circuit 406 and of delay circuitry and signal timing delay examples.

In the example of FIG. 4, the delay circuit 406 illustrates a parallel connection of the multiple different delay cells D1 through DN. As further explained in the examples below, at least one cell of the group of delay cells in the delay circuit 406 can be configured to "loop back" or terminate a delay chain. One or more cells in the delay circuit 406 that follow the loop-back cell can be unused when a lesser or intermediate amount of delay is specified.

In an example, the pulse width adjust circuit 410 comprises a cell-based topology. The pulse width adjust circuit 410 can include an array or series of pulse width adjust cells, Cell PW1 through Cell PWN, and each cell can be configured to apply the same or different pulse width adjustment to the input signal. The pulse width adjust circuit 410 can be configured to receive a Pulse Width Adjust Code, such as from the deskew controller, and the Pulse Width Adjust Code can specify a magnitude or direction of pulse width change to apply to an input signal, such as using one or more of the pulse width adjust cells.

In an example, as few as zero or one of the cells in the pulse width adjust circuit 410 can be used, such as to provide a minimum pulse width change, or all of the cells in the pulse width adjust circuit 410 can be used to provide a maximum pulse width change. In an example, fewer than all of the cells in the pulse width adjust circuit 410 can be used to provide an intermediate pulse width change. FIG. 8A, FIG. 8B, FIG. 8C, FIG. 9, and FIG. 10 illustrate generally examples of the pulse width adjust circuit 410 and signal pulse width change examples.

The pulse width adjust circuit 410 illustrates a series connection of the multiple different pulse width adjust cells PW1 through PWN. Any one or more of the cells can be configured in an active pulse width adjust mode or in a bypass mode. Cells in the active mode can influence a pulse width characteristic of the signal, whereas cells in the bypass mode can be substantially or entirely unused, or can be removed from the signal chain to avoid signal degradation.

Figure 5A:
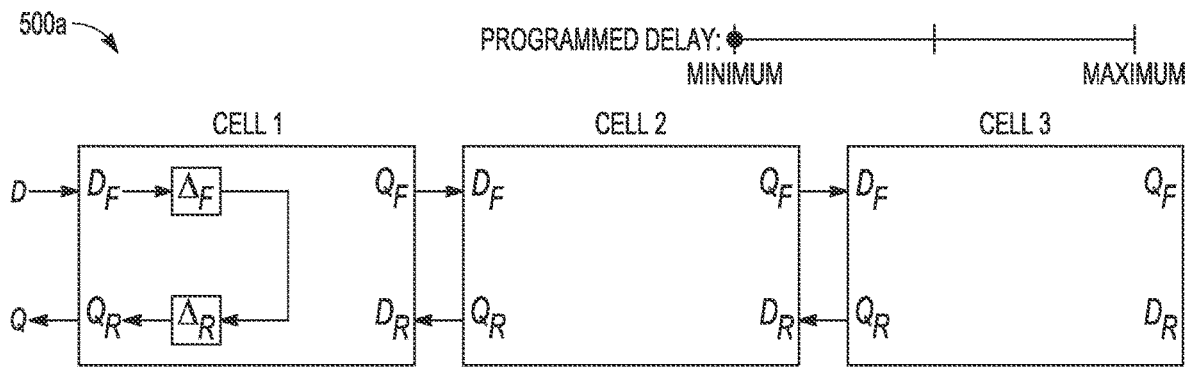
FIG. 5A illustrates generally an example of a first delay cell array.
Figure 5B:
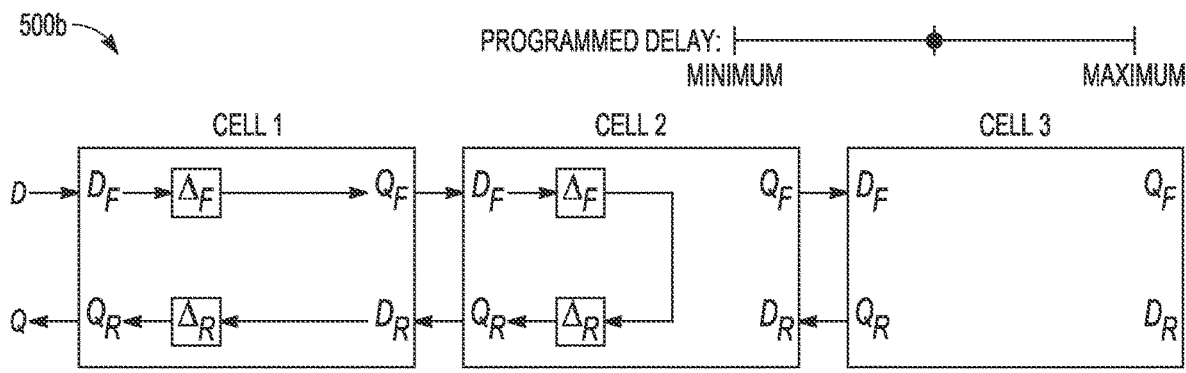
FIG. 5B illustrates generally an example of a second delay cell array.
Figure 5C:
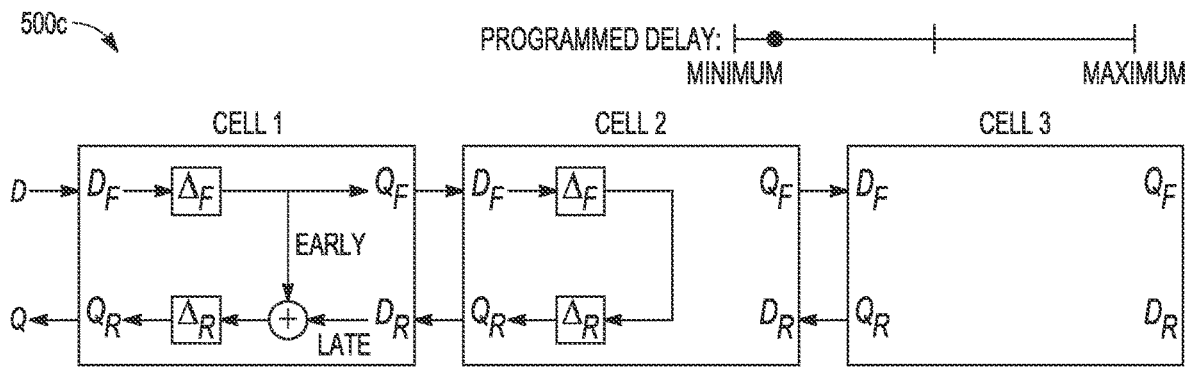
FIG. 5C illustrates generally an example of a third delay cell array.

FIG. 5A, FIG. 5B, and FIG. 5C illustrate generally an example of a deskew cell array for providing an adjustable signal delay. For example, FIG. 5A includes a first delay cell array 500a, FIG. 5B includes a second delay cell array 500b, and FIG. 5C includes a third delay cell array 500c. The various deskew cell array examples can correspond generally to the delay circuit 406 from the example of FIG. 4.

In each delay cell array example, the illustrated array, or illustrated portion of a larger array, includes three discrete cells labeled "Cell 1", "Cell 2", and "Cell 3." Each of the cells is configured to receive an input signal via a forward input node $D_F$, delay the input signal by a delay duration, and then provide a delayed output signal via a reverse output node $Q_R$. If a greater delay amount is required than can be provided by a particular cell, then the particular cell can transmit the signal to an adjacent cell via a forward output node $Q_F$. The particular cell then receives a delayed signal from the adjacent cell via a reverse input node $D_R$, as further explained below. The Programmed Delay line, in each example, is a pictorial representation of a Delay Adjust Code relative to a Minimum delay and a Maximum delay available from the example three-cell array.

In the example of the first delay cell array 500a, the array provides a minimum delay, as shown on the Programmed Delay line. In this example, a first cell, Cell 1, is configured in a loop-back configuration. The first delay cell array 500a can receive an input signal D, delay the signal by a forward delay duration $\Delta_F$ and a reverse delay $\Delta_R$ in Cell 1 and provide a delayed output signal Q. In the example of the first delay cell array 500a, a total delay from the input signal) to the delayed output signal Q is $(\Delta_F+\Delta_R)$.

In the example of the second delay cell array 500b, the array provides a first intermediate delay, greater than the minimum delay, as shown on the Programmed Delay line for FIG. 5B. The first intermediate delay is generated using a combination of Cell 1 and an adjacent cell, Cell 2, where Cell 1 is configured in a pass-through configuration and Cell 2 is configured in a loop-back configuration. As shown in the figure, an input signal D enters the deskew, where it passes through Cell 1 to Cell 2 and back to Cell 1, and exits the deskew as the delayed output signal Q. The total delay in this example is $(2\Delta_F+2\Delta_R)$, because the signal is delayed by the forward delay $\Delta_R$ of Cell 1, the forward delay $\Delta_F$ of Cell 2, the reverse delay $\Delta_R$ of Cell 2, and the reverse delay $\Delta_R$ of Cell 1.

In the example of the third delay cell array 500c, the array provides a second intermediate delay, which is greater than the minimum delay and smaller than the first intermediate delay. This delay is provided by interpolating between an Early delay signal and a late delay signal, where Cell 1 is configured in an interpolating configuration and Cell 2 is configured in a loop-back configuration. The Early delay signal can be generated by delaying the input signal D by a first delay amount, such as the forward delay $\Delta_F$ of Cell 1, for a total delay of $\Delta_F$. The late delay signal can be generated by delaying the Early delay signal, which already has a delay of $\Delta_F$, by the forward delay $\Delta_F$ of Cell 2 and the reverse delay $\Delta_R$ of Cell 2, for a total delay of $(2\Delta_F+\Delta_R)$. The interpolation between the early delay signal and the late delay signal will result in an interpolation delay signal with a total delay between $\Delta_F$ and $(2\Delta_F+\Delta_R)$. Cell 1, then, delays the interpolation delay signal by the reverse delay $\Delta_R$ and provides a delayed output signal Q, with a total delay that is between $1\times(\Delta_F+\Delta_R)$ and $2\times(\Delta_F+\Delta_R)$. In this way, the deskew can provide any delay between the minimum delay and the first intermediate delay.

The three-cell array example can be extended to understand how a deskew system with many cells can provide a delay between an arbitrary Minimum delay and Maximum delay. By selecting a middle cell (e.g., Cell n) to be in an interpolation configuration, placing all previous cells (e.g., Cell 1 to Cell (n−1)) to be in a pass-through configuration, and placing an adjacent cell following Cell n (e.g., Cell (n+1)) to be in a loop-back configuration, a delay between $n\times(\Delta_F+\Delta_R)$ and $(n+1)\times(\Delta_F+\Delta_R)$ can be provided. In this manner, any delay amount between the Minimum delay and the Maximum delay can be provided by changing which cell is Cell n, or in an interpolation configuration, such as while keeping all previous cells in a pass-through configuration and a next or subsequent cell in a loop-back configuration.

Figure 6:
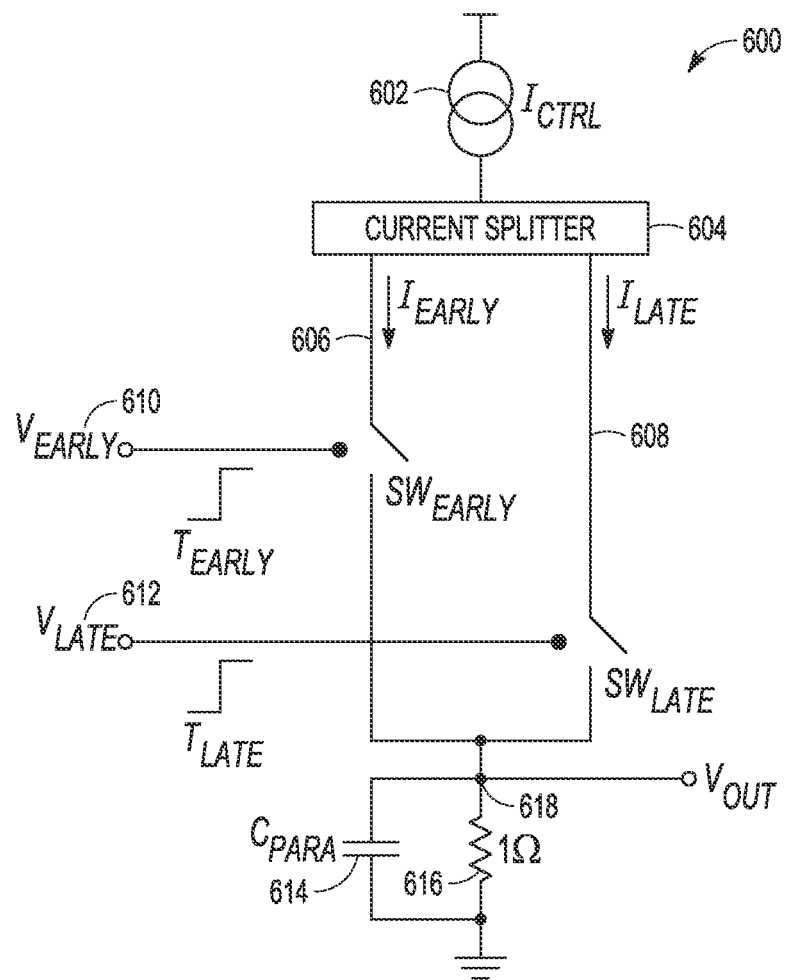
FIG. 6 illustrates generally an example of a first signal delay circuit.

FIG. 6 illustrates generally an example of a first signal delay circuit 600 that can be used to generate a delayed signal. In an example, the first signal delay circuit 600 comprises an example of a delay circuit that can be used in one or more delay cells, such as to interpolate between two input signals and generate a controllably delayed output signal (see, e.g., the discussion of FIG. 5A-FIG. 5C). The first signal delay circuit 600 includes a current splitter 604 (e.g., a circuit configured to divide or apportion a current signal) configured to receive a source current signal $I_{CTRL}$ from a current source 602 and divide the source current signal into early and late currents, $I_{EARLY}$ and $I_{LATE}$, in respective signal paths, including a first current signal path 606 and a second current signal path 608. The current splitter 604 divides or apportions the source current signal $I_{CTRL}$ based on a specified delay amount or delay duration, such that the sum of $I_{EARLY}$ and $I_{LATE}$ is equal to $I_{CTRL}$. The first current signal path 606 includes an early switch, $SW_{EARLY}$, and the second current signal path 608 includes a late switch, $SW_{LATE}$. The early and late switches are separately actuated by input signals at an early signal input node 610 and a late signal input node 612, respectively. Following the early and late switches, the first and second current signal paths are coupled to a summing node 618, which is also coupled to a load resistor 616 and a capacitor 614.

In an example, the delay cells in the examples of FIG. 5A through FIG. 5C can each include or comprise one or more instances of the first signal delay circuit 600. In a first example, the early signal input node 610 can be configured to receive a forward input signal $V_{EARLY}$, such as corresponding to the input signal D, and the late signal input node 612 can be unused. An output, such as $V_{OUT}$ at the summing node 618, can correspond to the forward output node $Q_F$. In a second example, the early signal input node 610 can be configured to receive a forward input signal $V_{EARLY}$, such as corresponding to the signal at the forward output node $Q_F$, and the late signal input node 612 can be configured to receive a reverse input signal $V_{LATE}$, such as corresponding to the signal at the reverse input node $D_R$. An output, such as $V_{OUT}$ at the summing node 618, can correspond to the reverse output node $Q_R$.

Figure 7:
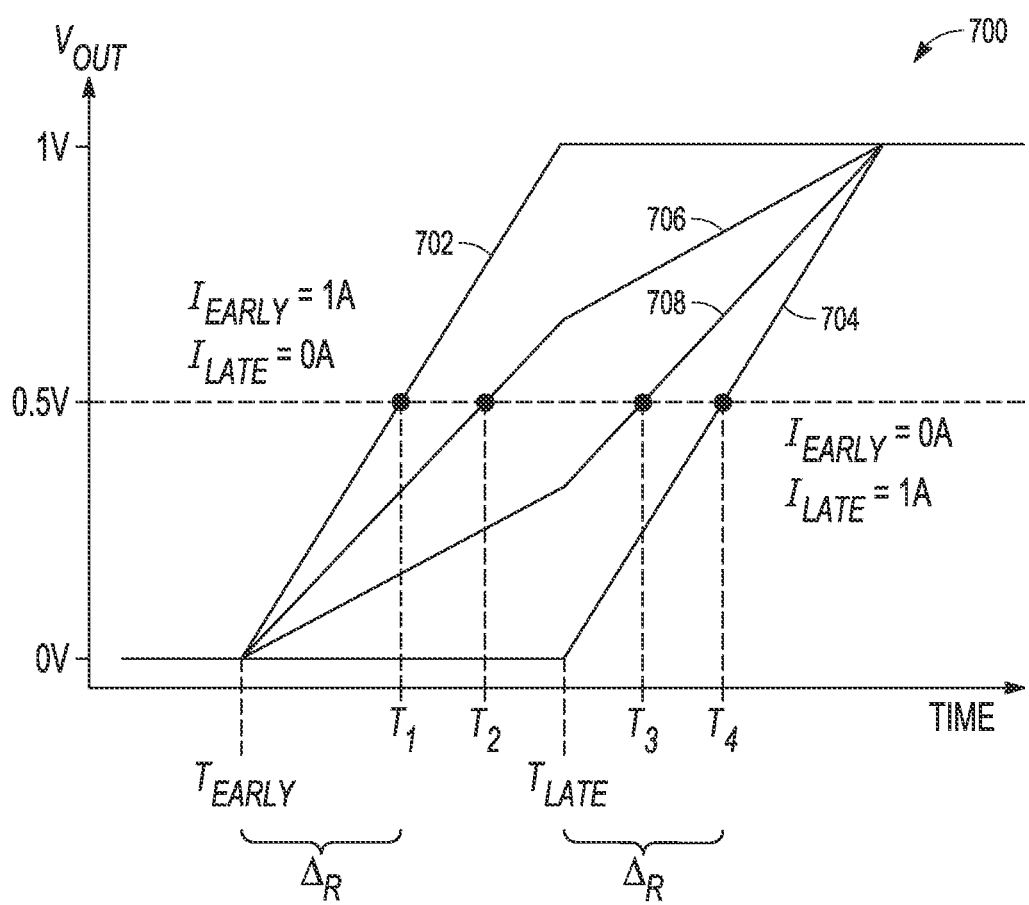
FIG. 7 illustrates generally a delay output signal chart corresponding to the first signal delay circuit.

FIG. 7 illustrates generally an example showing a relationship between a summing node signal and a source current signal. The example of FIG. 7 includes a delay output signal chart 700 showing a voltage $V_{OUT}$ at the summing node 618 of the first signal delay circuit 600, according to examples of different delays. The delay output signal chart 700 includes a first trace 702 and a second trace 704 that correspond to circuit configurations that provide minimum and maximum delays, respectively. The first trace 702 corresponds to a circuit configuration wherein the current splitter 604 provides a 1 amp current signal to the first current signal path 606 and provides no current signal to the second current signal path 608. This results in the summing node 618 charging to the midscale voltage, 0.5 V, at time $T_1$, due to a signal $V_{EARLY}$ transitioning from low to high, at time $T_{EARLY}$, at the early signal input node 610. The second trace 704 corresponds to a circuit configuration wherein the current splitter 604 provides a 1 amp current signal to the second current signal path 608 and provides no current signal to the first current signal path 606. This results in the summing node 618 charging to 0.5 V at time $T_4$, due to a signal $V_{LATE}$ transitioning from low to high, at time $T_{LATE}$, at the late signal input node 612.

The delay output signal chart 700 includes a third trace 706 and a fourth trace 708 that show intermediate delays, such as when the current splitter 604 divides the source current signal, $I_{CTRL}$, between the first current signal path 606 and the second current signal path 608. The third trace 706, for example, corresponds to a circuit configuration where the first current signal path 606 carries a larger current signal than the second current signal path 608, resulting in the summing node 618 charging to 0.5 V at time $T_2$. The fourth trace 708 corresponds to a circuit configuration where the second current signal path 608 carries a larger current than the first current signal path 606, resulting in the summing node 618 charging to 0.5 V at time $T_3$.

The examples of FIG. 7 thus shows generally that the first signal delay circuit 600 can produce a signal that is selectively and adjustably delayed, relative to an input signal, based on an amount of current that is provided to each of the first current signal path 606 and the second current signal path 608 by the current splitter 604. In the third trace 706, where there is relatively more current distributed to the first current signal path 606, the voltage $V_{OUT}$ transitions at time $T_2$, which is closer to the minimum delay transition at time $T_1$ than the maximum delay transition at time $T_4$. As more current is passed to the second current signal path 608 by the current splitter 604, the resulting signal transition shifts closer to the maximum delay transition, such as corresponding to the fourth trace 708. In this way, the source current signal $I_{CTRL}$ can be divided in any proportion or ratio to provide an intermediate delay amount between the minimum and maximum delays.

Referring again to FIG. 7, the slew rate of the first trace 702, corresponding to the minimum delay, can be substantially the same as the slew rate of the second trace 704, corresponding to the maximum delay. Therefore, delay from $T_{EARLY}$ to $T_1$ can be substantially the same as the delay from $T_{LATE}$ to $T_4$. This also implies that the delay from $T_1$ to $T_4$ is substantially the same as the delay from $T_{EARLY}$ to $T_{LATE}$. Therefore, the resulting signal transition can be an interpolation between the signals $V_{EARLY}$ and $V_{LATE}$ and a function of a fixed delay (e.g., $T_1-T_{EARLY}$, or $T_4-T_{LATE}$), such as can be represented by the reverse delay $\Delta_R$. The interpolation, which can also be considered an adjustable delay between 0 and ($T_{LATE}-T_{EARLY}$), is determined by the relationship between, or values of, $I_{EARLY}$ and $I_{LATE}$ provided by the current splitter 604.

Figure 8A:
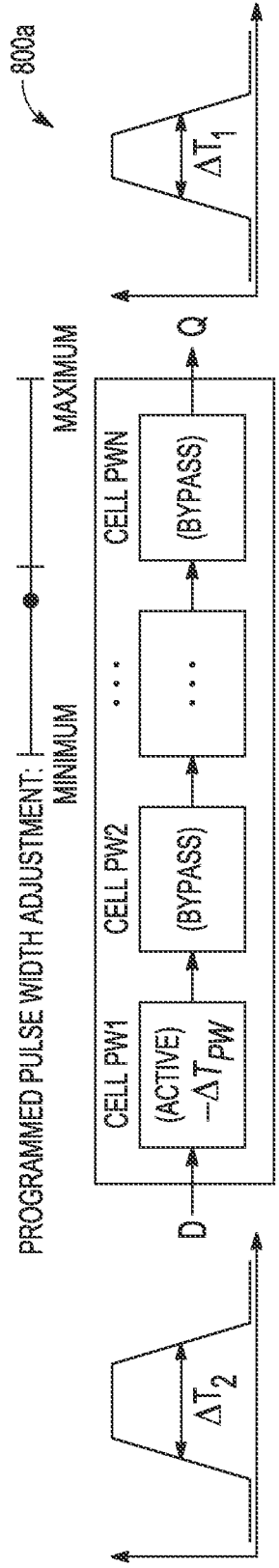
FIG. 8A illustrates generally an example of a first pulse width adjust cell array.
Figure 8B:
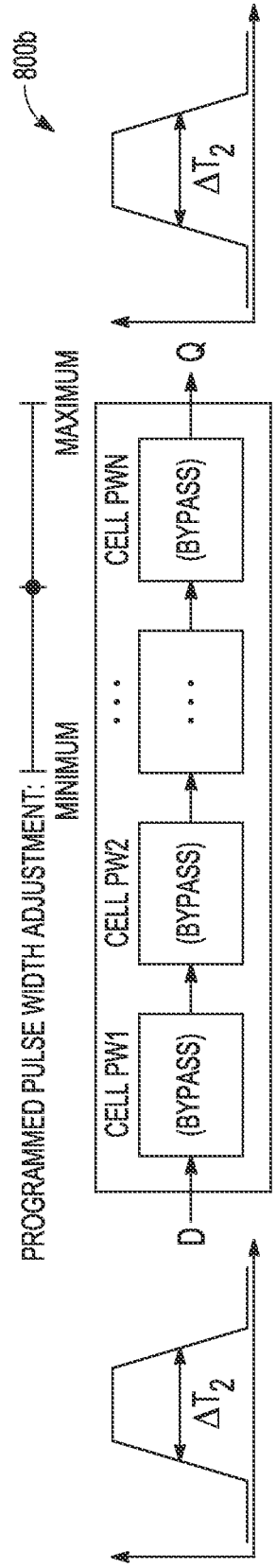
FIG. 8B illustrates generally an example of a second pulse width adjust cell array.
Figure 8C:
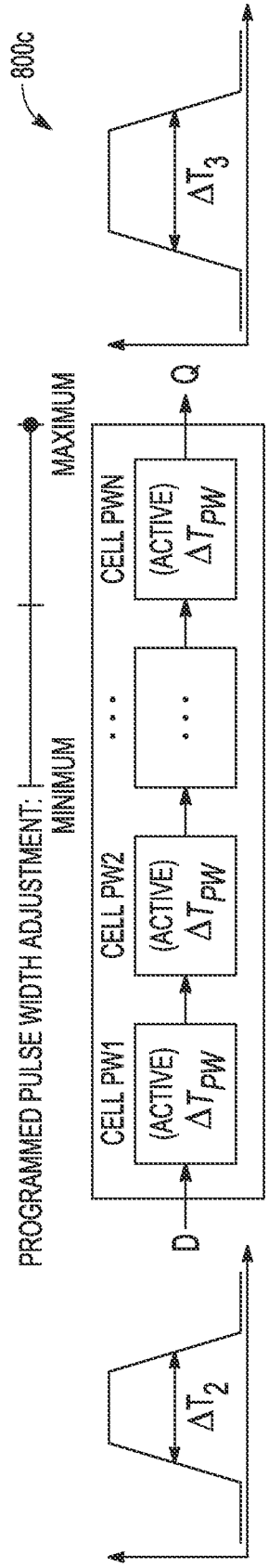
FIG. 8C illustrates generally an example of a third pulse width adjust cell array.

FIG. 8A, FIG. 8B, and FIG. 8C illustrate generally examples of differently configured cells in a pulse width adjust cell array, such as for providing a signal with an adjustable pulse width. For example, FIG. 8A includes a first pulse width adjust cell array 800a, FIG. 8B includes a second pulse width adjust cell array 800b, and FIG. 8C includes a third pulse width adjust cell array 800c. The various pulse width adjust cell array examples can correspond generally to the pulse width adjust circuit 410 from the example of FIG. 4.

Each of the illustrated pulse width adjust cell array examples includes N pulse width adjust cells labeled "Cell PW1" through "Cell PWN." Each of the cells can be configured in an active mode in which an input signal receives a pulse width adjustment, or in a bypass mode in which an input signal is unchanged. In an example, each cell is configured to receive an input signal D via a forward input node, adjust the input signal by a specified pulse width adjustment amount, and then provide a delayed output signal Q via an output node. If a greater amount of pulse width adjust is required than can be provided by one cell, then multiple cells can be placed in the active mode. The examples include a Programmed Pulse Width Adjustment line which is a pictorial representation of a Pulse Width Adjust Code relative to a minimum (e.g., corresponding to a maximum decrease of pulse width) and a maximum (e.g., corresponding to a maximum increase of pulse width) that is available using the array.

In the example of the first pulse width adjust cell array 800a, the array can provide an intermediate pulse width adjustment, as shown on the Programmed Pulse Width Adjustment line. In this example, fewer than all of the N pulse width adjustment cells is configured in an active mode, or pulse width adjustment mode, and other cells in the array are configured in a bypass mode. The first pulse width adjust cell array 800a can receive the input signal D, such as having a pulse width duration of $\Delta T_2$ at a first cell, Cell PW1, and in response can provide an output signal Q, such as having a different pulse width duration $\Delta T_1$. In the example of the first pulse width adjust cell array 800a, the first pulse width adjust cell PW1 is configured to decrease a pulse width characteristic of the input signal such that $\Delta T_2 > \Delta T_1$. In other words, since the Programmed Pulse Width Adjustment indicates a value that is less than a midscale value, the first pulse width adjust cell PW1 can be configured to apply a negative pulse width adjustment such that the output signal has a lesser pulse width relative to the input signal.

In the example of the second pulse width adjust cell array 800b, the array provides effectively zero pulse width adjustment, as shown on the Programmed Pulse Width Adjustment line at midscale. In this example, each of the N pulse width adjustment cells is configured in a bypass mode. The second pulse width adjust cell array 800b thus can receive an input signal D, such as having a pulse width duration of $\Delta T_2$ at a first cell, Cell PW1, and in response can provide an output signal Q, such as having substantially or identically the same pulse width duration $\Delta T_2$.

In the example of the third pulse width adjust cell array 800c, the array can provide a maximum pulse width adjustment, as shown on the Programmed Pulse Width Adjustment line. In this example, all of the N pulse width adjustment cells are configured in an active mode, or pulse width adjustment mode. The third pulse width adjust cell array 800c can receive the input signal D, such as having a pulse width duration of $\Delta T_2$ at a first cell, Cell PW1, and in response can provide an output signal Q, such as having a different pulse width duration $\Delta T_3$. In the example of the third pulse width adjust cell array 800c, each of the N pulse width adjust cells PW1 through PWN can be configured to extend or increase a pulse width characteristic of the input signal such that $\Delta T_3 > \Delta T_2$, however, the cells could be similarly configured to decrease the pulse width characteristic of the input signal such that $\Delta T_3 < \Delta T_2$.

In the examples of FIG. 8A through FIG. 8C, each of the N cells can introduce some negligible or non-negligible jitter that can influence an actual pulse width of the output signal. Each of the cells can introduce jitter in a bypass mode or in an active or pulse width adjustment mode. That is, since the signal flows in a serial manner through N different cells, the output signal can be affected by jitter or other signal coloration that can be introduced by any one or all of the cells. Total jitter, in the examples of FIG. 8A through FIG. 8C, can be a function of the number N of cells used in a system, and N is the number of cells used to provide a specified maximum pulse width adjustment.

Figure 9:
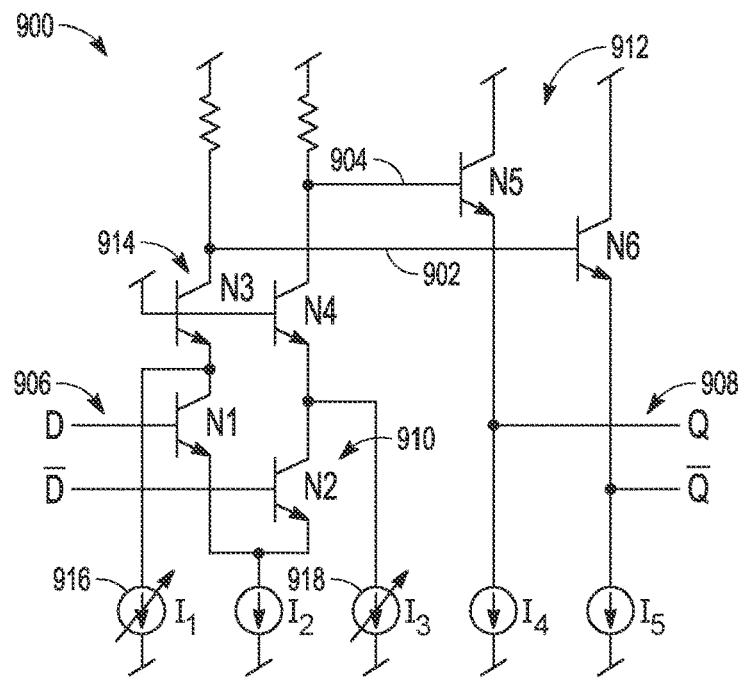
FIG. 9 illustrates generally an example of a first pulse width adjust circuit.

FIG. 9 illustrates generally an example of a first pulse width adjust circuit 900 that can be used to generate a pulse width adjusted signal. In an example, the first pulse width adjust circuit 900 comprises an example of a pulse width adjustment circuit that can be used in one or more pulse width adjustment cells, such as to provide a controlled, pulse width-adjusted signal. The first pulse width adjust circuit 900 can be configured to receive an input signal D (e.g., as a differential signal comprising components D and D-bar) at a pulse width circuit input 906 and, in response, provide a corresponding output signal Q (e.g., as a differential signal) at a pulse width circuit output 908. The output signal Q can have a different pulse width characteristic than the input signal D.

The first pulse width adjust circuit 900 includes a first differential pair 910, such as comprising first and second transistors N1 and N2, configured to receive the input signal. The first differential pair 910 is coupled to a common base stage 914, such as comprising third and fourth transistors N3 and N4 and respective load resistors. The first differential pair 910 and the common base stage 914 provide a cascode configuration. Outputs from the cascode can drive an emitter follower pair 912, such as comprising fifth and sixth transistors N5 and N6. In the example of FIG. 9, the emitters of the first and second transistors N1 and N2 of the first differential pair 910 are biased by a common current source I2, and emitters of the fifth and sixth transistors N5 and N6 are biased by respective current sources I4 and I5.

In an example, the outputs from the cascode can comprise a first pulse width timing signal 902 and a second pulse width timing signal 904. Amplitude characteristics of the timing signals can be influenced by, among other things, the values of the load resistors and current signals that can be respectively provided to the cascode. For example, a first current source I1, or first adjustable current source 916, and a third current source I3, or second adjustable current source 918, can comprise respective keep-alive current sources that are configured to provide respective bias signals in each leg of the cascode, to thereby ensure a minimum voltage drop across the load resistors. The pulse width timing signals, or outputs from the cascode, can each comprise a respective combination or superposition of a voltage at the load resistor and the voltage switched through the corresponding leg of the first differential pair 910. The voltage at the load resistors, or the first pulse width timing signal 902 and the second pulse width timing signal 904, is thus a function of the bias signals provided by the first adjustable current source 916 and the second adjustable current source 918. Stated differently, variable current sources, such as the first adjustable current source 916 and the second adjustable current source 918, can be used to adjust a common mode of the first pulse width timing signal 902 and the second pulse width timing signal 904 of the first pulse width adjust circuit 900. In coordination with the adjusted common mode signal, a resulting or corresponding change in output signal pulse width can be provided.

Figure 10:
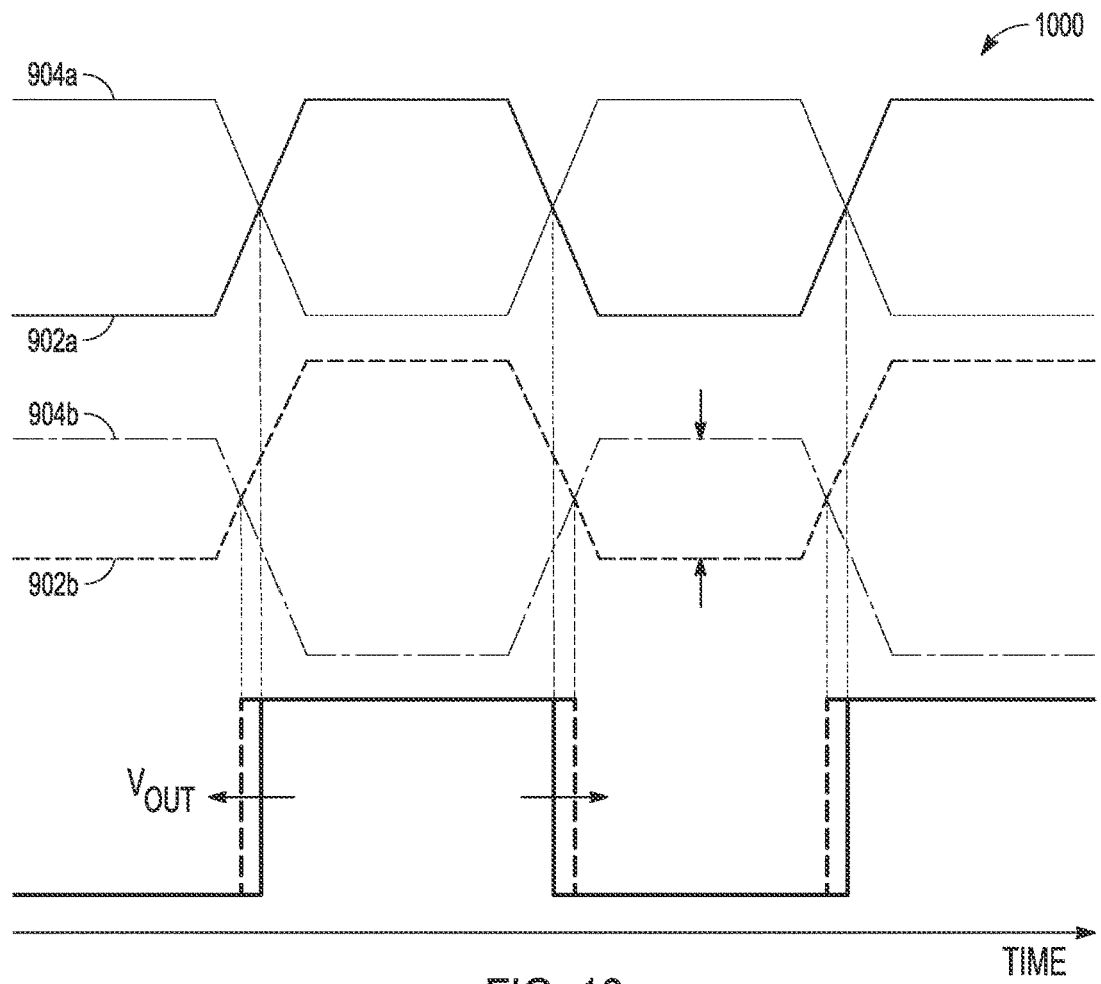
FIG. 10 illustrates generally a signal timing diagram corresponding to the first pulse width adjust circuit.

FIG. 10 illustrates generally an example 1000 that shows a relationship between the cascode outputs from the example of the first pulse width adjust circuit 900 and its differential output signal, such as from the pulse width circuit output 908. In the example 1000, the output signal $V_{OUT}$ is a representation of a relationship between crossings of the output signals Q and Q-bar. A pulse width characteristic of the output signal $V_{OUT}$ depends on a relationship between the first pulse width timing signal 902 and the second pulse width timing signal 904.

In the example of FIG. 10, crossings of an initial first pulse width timing signal 902*a* and an initial second pulse width timing signal 904*a* correspond to transitions in the output signal, such as from low to high, or from high to low. The common mode of the two signals can be independently adjusted, such as by controlling an amplitude of the bias signals provided by the first adjustable current source 916 or the second adjustable current source 918. In an example, an adjusted first pulse width timing signal 902*b* can correspond to a decrease in an amount of bias current provided by the first adjustable current source 916, and an adjusted second pulse width timing signal 904*b* can correspond to a increase in an amount of bias current provided by the second adjustable current source 918. As a result of the bias changes, the crossings of the adjusted first pulse width timing signal 902*b* and the adjusted second pulse width timing signal 904*b* can shift in time and a pulse width of the representative output signal Vou-r can correspondingly change.

Referring again to FIG. 4, the first deskew system 400 includes the delay circuit 406 and the pulse width adjust circuit 410, such as can comprise separate functional blocks or circuitry. Each of the delay circuit 406 and the pulse width adjust circuit 410 can have different requirements in terms of die size, cost, power consumption, control circuitry, and other characteristics. In the example of the pulse width adjust circuit 410, the cells that comprise the pulse width adjust circuit 410 are coupled in series and, in some examples, each cell is powered during operation. That is, respective bias sources or current sources in the pulse width adjustment cells can be active and can contribute to overall power consumption of the system. In an example, the series-coupled cells can each introduce jitter or edge placement deviation from an original input signal, including when the pulse width adjust cells are in a bypass mode or minimum adjustment mode. For example, jitter can accumulate as the signals pass through each differential pair or cascode amplifier in each of the pulse width adjustment cells.

In an example, a solution to these and other problems associated with the first deskew system 400 can include or use a cell-based deskew system topology with hybrid cells that include delay and pulse width adjustment functions. With the delay and pulse width adjustment functions together in each hybrid cell in a system, support or control circuitry can be consolidated and infrastructure can be shared. Power savings can be realized by the consolidated architecture, and test system die area can be reduced. In an example, the system can include cells that can be configured to impart signal delay or adjust a pulse width characteristic, and fewer than all of the cells in the system can be used. Using fewer cells or a minimum number of cells can help reduce jitter and can help reduce power consumption.

Figure 11:
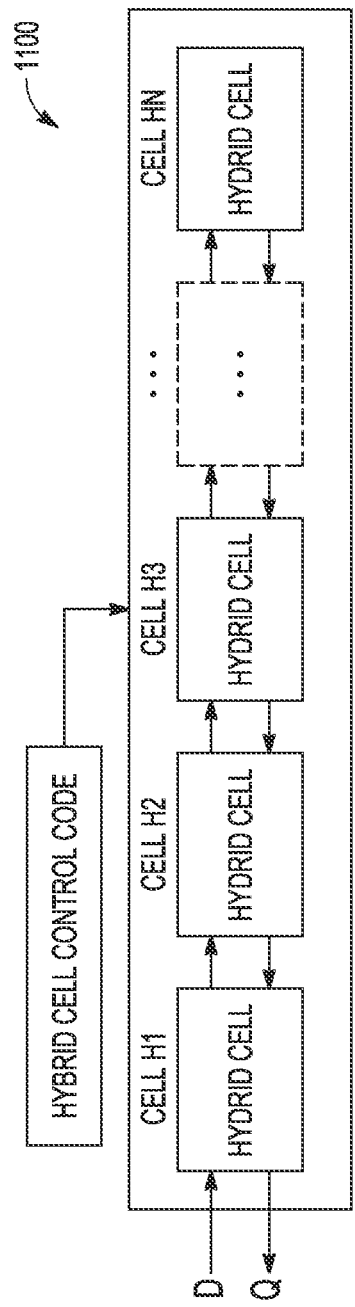
FIG. 11 illustrates generally an example of a hybrid cell deskew system.

FIG. 11 illustrates generally an example of a hybrid cell deskew system 1100. The hybrid cell deskew system 1100 can be configured to receive an input signal D, process the signal using one or more hybrid cells, and then provide an output signal Q that is deskewed relative to the input signal, such as in terms of delay and/or pulse width. The example of the hybrid cell deskew system 1100 includes a cell-based system with an array of N different hybrid cells labeled Cell H1 through Cell HN. Although the example of FIG. 11 shows the hybrid cell deskew system 1100 as including exclusively hybrid cells, other systems can include a combination of hybrid cells, delay cells (e.g., one or more cells from the example of the delay circuit 406), or pulse width adjust cells (e.g., one or more cells from the example of the pulse width adjust circuit 410).

The hybrid cell deskew system 1100 can be configured to receive a Hybrid Cell Control Code, such as from a deskew controller. The Hybrid Cell Control Code can include one or more signals that are configured to specify, for example, configuration instructions for one or more of the hybrid cells, such as including information about a magnitude of delay to be applied to an input signal (e.g., a Delay Adjust Code), or information about a magnitude or direction of a pulse width change to apply to an input signal (e.g., a Pulse Width Adjust Code). In an example, information in the Hybrid Cell Control Code can be used to configure each hybrid cell in the system as a delay cell or a pulse width adjustment cell.

In an example, one or more leading cells or first cells to receive the input signal can be configured as pulse width adjustment cells, and following or subsequent cells can be configured as delay cells. In an example, one or more leading cells or first cells to receive the input signal can be configured as delay cells, and following or subsequent cells can be configured as pulse width adjustment cells. In another example, a hybrid cell can be configured to delay and adjust a pulse width of an input signal. In an example, at least one of the cells in the hybrid cell deskew system 1100 can be configured as a loop-back cell in which the signal path direction returns toward, and propagates through, return paths in one or more of the preceding cells in the system. In other examples, one or more of the cells can comprise a signal tap from which a delayed signal or pulse width adjusted signal can be received or monitored.

In an example, a minimum number of cells in the hybrid cell deskew system 1100 can be used, such as to provide a minimum signal delay, or minimum pulse width adjustment. In another example, all of the cells in the hybrid cell deskew system 1100 can be used to provide a maximum signal delay or a maximum pulse width adjustment. In an example, fewer than all of the cells in the delay circuit 406 can be used to provide an intermediate signal delay or an intermediate pulse width adjustment, such as according to information or instructions in the Hybrid Cell Control Code.

Figure 12:
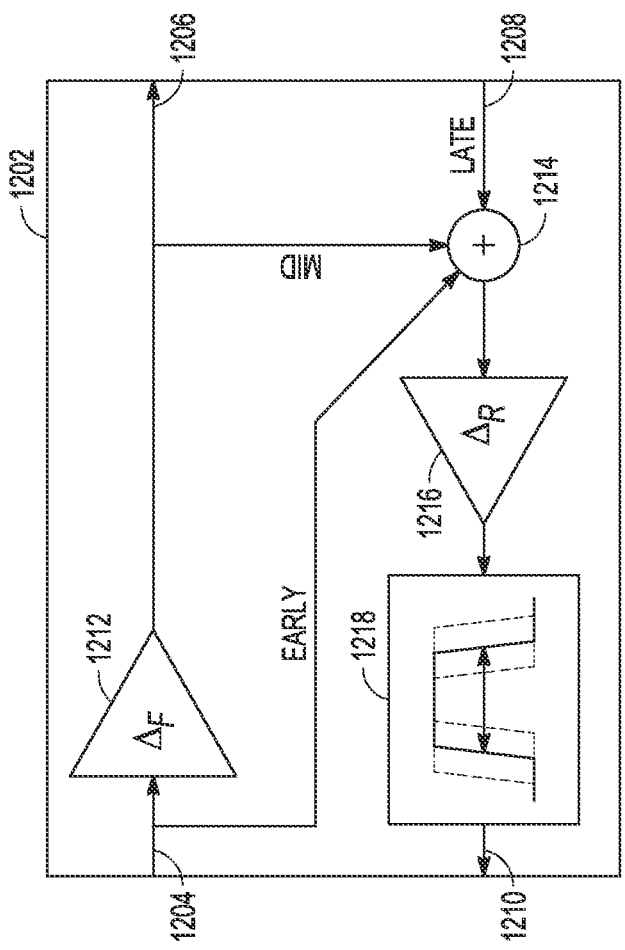
FIG. 12 illustrates generally a block diagram of a hybrid deskew cell.

FIG. 12 illustrates generally a block diagram example of a hybrid cell 1202. The hybrid cell 1202 can comprise an example of one of the hybrid cells H1 through HN from the example of FIG. 11. The hybrid cell 1202 can include a forward input node 1204 configured to receive an input signal (e.g., $V_{IN}$) and, in response, provide a forward output signal to a subsequent cell at a forward output node 1206, or provide an output signal (e.g., $V_{OUT}$) at a reverse output node 1210. The hybrid cell 1202 can be configured to receive a control signal, such as the Hybrid Cell Control Code from the example of FIG. 11, and information in the control signal can be used to configure the hybrid cell 1202 to provide a delay, to provide a pulse width adjustment, or both. Information in the control signal can define a magnitude of the delay or of the pulse width adjustment.

The hybrid cell 1202 can include a forward signal delay circuit 1212 in a forward path between the forward input node 1204 and the forward output node 1206. The hybrid cell 1202 can additionally or alternatively include a reverse signal delay circuit 1216 in a reverse path between the reverse input node 1208 and the reverse output node 1210. The forward signal delay circuit 1212 and the reverse signal delay circuit 1216 can be configured to provide fixed or variable signal delays to signals at their respective inputs, such as using information from the Hybrid Cell Control Code.

The hybrid cell 1202 includes a pulse width adjust cell circuit 1218 configured to provide a pulse width adjustment. In the example of FIG. 12, the pulse width adjust cell circuit 1218 is provided in the reverse signal path between the reverse signal delay circuit 1216 and the reverse output node 1210. In other examples, the pulse width adjust cell circuit 1218 can be provided elsewhere in the hybrid cell 1202, such as in the forward path between the forward signal delay circuit 1212 and the forward output node 1206, or between the forward input node 1204 and the forward signal delay circuit 1212, or elsewhere.

The example of the hybrid cell 1202 can be configured to provide an adjustable delay such as using information on the Early, Mid or middle, or Late data signal paths. Mort et al., in U.S. Pat. No. 10,547,294, titled "Deskew Circuit for Automated Test Systems," which is incorporated herein by reference in its entirety, illustrates various examples of delay circuits that can be configured with Early, Mid or middle, and Late signal paths, such as at FIGS. 12 through 17, and in the corresponding description thereof. For ease of illustration of the hybrid cell introduced herein, discussion is generally limited to example circuitry or cells with two data signal paths rather than all three of the Early, Mid, and Late data signal paths from the example of FIG. 12 and of Mort et al.

In the example of FIG. 12, the hybrid cell 1202 includes a summing circuit 1214 that can receive information from the Early, Mid, and Late signal paths and can combine the information to provide a delayed or pulse width adjusted signal at the reverse output node 1210, such as via the reverse signal delay circuit 1216 or the pulse width adjust cell circuit 1218.

Figure 13:
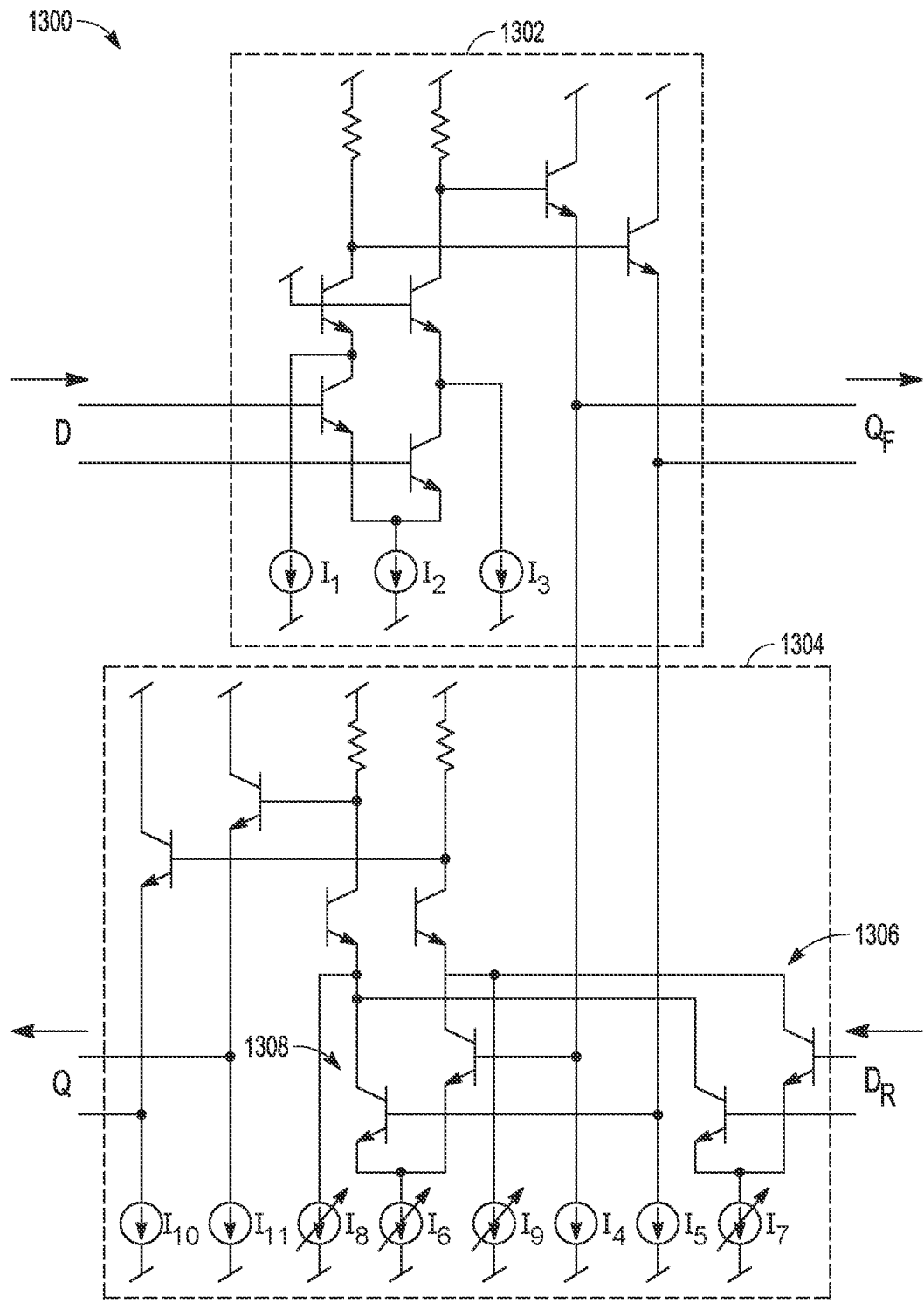
FIG. 13 illustrates generally a schematic example of a first hybrid cell.

FIG. 13 illustrates generally an example of a first hybrid cell 1300. The first hybrid cell 1300 is configured to provide a selectable delay and selectable pulse width adjustment to an input signal D. The first hybrid cell 1300 includes a forward path circuit 1302 and a reverse path circuit 1304. In an example, circuitry in the forward path circuit 1302 or in the reverse path circuit 1304 can be used to adjust a pulse width or delay characteristic of the input signal, such as according to instructions from the Hybrid Cell Control Code. In an example, current sources in one or more of the forward path circuit 1302 and the reverse path circuit 1304 can be adjusted to provide the delay or pulse width adjustment.

In an example, the forward path circuit 1302 includes a first instance of the first pulse width adjust circuit 900. For example, an input of the forward path circuit 1302 can be configured to receive the differential input signal D. The input can comprise the pulse width circuit input 906 from the example of FIG. 9. An output of the forward path circuit 1302 can be configured to provide a forward signal output and, for example, can comprise the pulse width circuit output 908 from the example of FIG. 9.

In the forward path circuit 1302, the first through fifth current sources I1 through I5 can be configured to provide respective fixed bias currents. The respective signals can have the same or different current magnitude and can be a minimum current magnitude that enables the forward path circuit 1302 to act substantially as a pass-through circuit without imparting pulse width adjustment to the input signal.

In an example, the reverse path circuit 1304 includes a second instance of the first pulse width adjust circuit 900 coupled to a delay circuit late path differential pair 1306 and delay circuit early path differential pair 1308. The delay circuit late path differential pair 1306 can receive a bias current signal from a seventh current source I7, and can receive a reverse signal $D_R$, such as from an adjacent cell (e.g., a subsequent cell) in a hybrid cell array. The delay circuit early path differential pair 1308 can receive a bias current signal from a sixth current source I6, and can provide a delayed signal to the second instance of the first pulse width adjust circuit 900. The delayed signal can be delayed relative to the input signal D and/or relative to the received reverse signal, $D_R$. A delay characteristic of the reverse path circuit 1304 can be set or adjusted by a magnitude of the current signals used to bias the delay circuit lath path differential pair 1306 or the delay circuit early path differential pair 1308. That is, a magnitude of the delay imparted can be based on a magnitude of the current provided by the sixth current source or the seventh current source, or both. In an example, the magnitude of the current signals provided by the sixth and seventh current sources can be set by the Hybrid Cell Control Code.

In an example, the second instance of the first pulse width adjust circuit 900, in the reverse path circuit 1304, can be used to adjust a pulse width characteristic of the reverse signal $D_R$, or a delay-adjusted version of the reverse signal as provided by the delay circuit late path differential pair 1306 and the delay circuit early path differential pair 1308. The second instance of the first pulse width adjust circuit 900 can include respective current sources, such as an eighth current source I8 and a ninth current source I9. A magnitude of the pulse width adjustment imparted by the reverse path circuit 1304 can be set by adjusting the magnitude of the current signals provided by the eighth and ninth current sources, such as in accordance with information from the Hybrid Cell Control Code. An output stage of the second instance of the first pulse width adjust circuit 900 can be biased by tenth and eleventh current sources I10 and I11, respectively, and can provide the output signal Q from the reverse path circuit 1304 of the first hybrid cell 1300.

Figure 14:
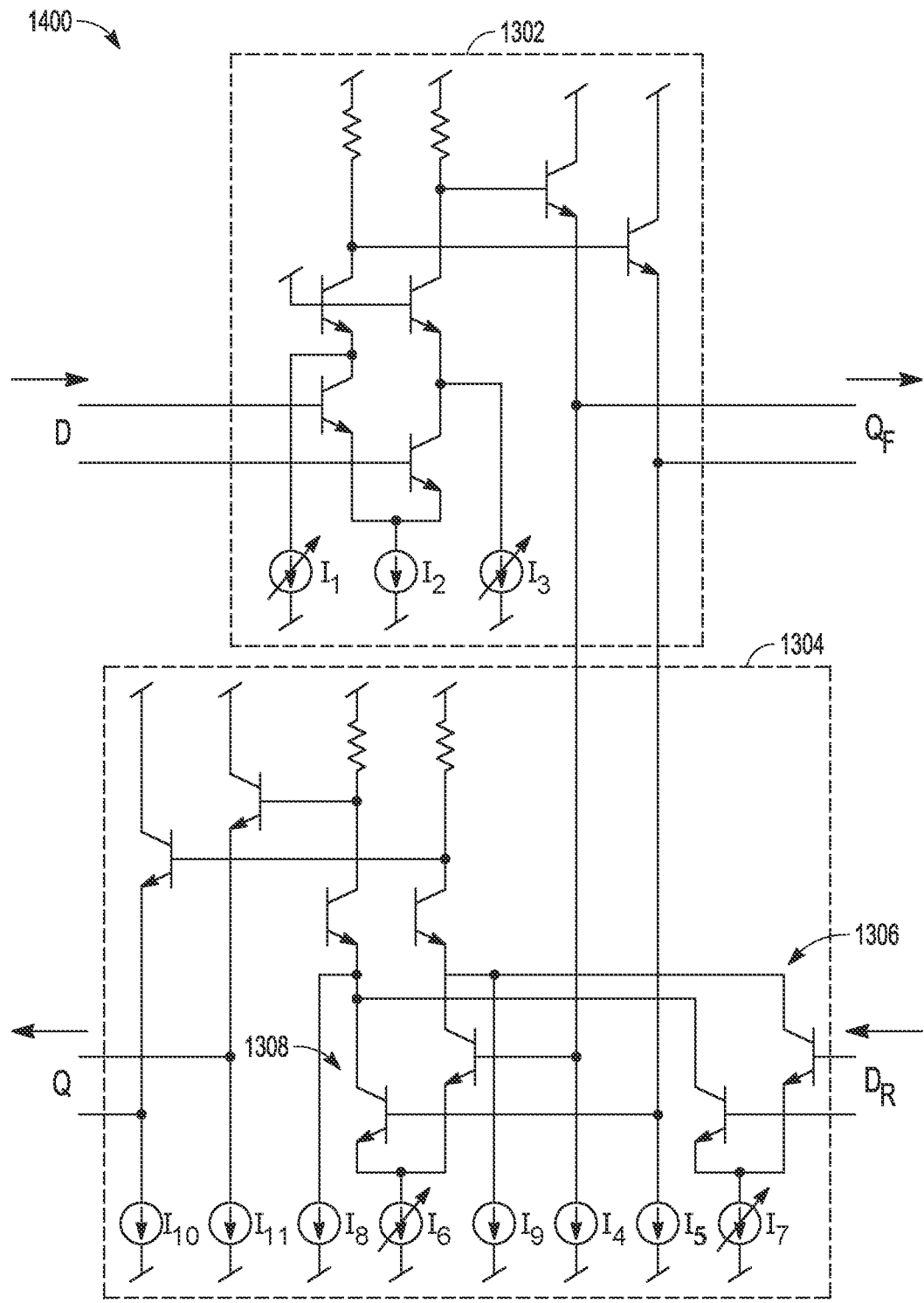
FIG. 14 illustrates generally a schematic example of a second hybrid cell.

FIG. 14 illustrates generally an example of a second hybrid cell 1400. Similarly to the first hybrid cell 1300, the second hybrid cell 1400 is configured to provide a selectable delay and selectable pulse width adjustment to the input signal D. The second hybrid cell 1400 includes the forward path circuit 1302 and the reverse path circuit 1304.

In the example of the second hybrid cell 1400, the first instance of the forward path circuit 1302 includes first and third current sources I1 and I3 that are configured to provide an adjustable current, such as can be based on the Hybrid Cell Control Code. The first and third current sources can be used to introduce a pulse width adjustment in a signal that is processed by the forward path circuit 1302. That is, the forward path circuit 1302 can be used to provide a pulse width adjustment to the input signal D such that the forward path output signal $Q_F$ is a pulse width-adjusted version of the input signal.

In the example of the second hybrid cell 1400, the eighth current source I8 and the ninth current source I9 in the reverse path circuit 1304 can be configured to provide a fixed bias current. The respective current signals can have the same or different current magnitude and can be a minimum current magnitude that enables the reverse path circuit 1304 to act substantially as a pass-through circuit without imparting a pulse width adjustment to the input signal. In an example, the sixth current source I6 and the seventh current source I7 can be used to set a delay characteristic of a signal processed by the reverse path circuit 1304. That is, similarly to the example described above in the discussion of FIG. 13, the reverse path circuit 1304 can use the delay circuit late path differential pair 1306 to receive a reverse signal $D_R$, such as from an adjacent cell in a hybrid cell array, and the delay circuit early path differential pair 1308 can provide a delayed signal to the second instance of the first pulse width adjust circuit 900. The delayed signal can be delayed relative to the input signal D and/or relative to the received reverse signal, $D_R$. In the example of FIG. 14, the second instance of the first pulse width adjust circuit 900 can be configured to provide a minimum pulse width adjustment or no pulse width adjustment.

In an example, further pulse width adjustment or control can be provided by adjusting the first current source I1, the third current source I3, the eighth current source I8, and the ninth current source I9 together. That is, pulse width adjustment circuitry can be provided in each of the forward path circuit 1302 and the reverse path circuit 1304 and can be used together to provide more pulse width adjustment or pulse width control. Control circuitry can be provided to generate the Hybrid Cell Control Code, such as can be used to control a magnitude of a current signal provided by any one or more of the first through eleventh current sources I1 through I11.

Pulse width adjustment and delay circuitry can thus be combined or integrated on or in a common cell, such as can be used in a cell-based deskew system, such as the hybrid cell deskew system 1100. Combining the pulse width adjustment and delay circuitry can facilitate sharing of resources and signal paths, resulting in a reduced overall system or device size, such as relative to the first deskew system 400 from the example of FIG. 4. Furthermore, power savings relative to the first deskew system 400 can be realized using the hybrid cell deskew system 1100 because unused cells can be powered down, and therefore may not contribute to overall system current consumption. Further still, signal jitter improvements can be realized using the hybrid cell deskew system 1100 because fewer than all of the cells in a system can be used to provide test signals.

In an example, the Hybrid Cell Control Code can include a delay code and a pulse width code. The delay code can comprise an analog or digital signal that is configured to specify an amount of delay that a particular hybrid cell is configured to impart or apply to an input signal. The delay code can comprise, for example, a 64 bit digital word. The pulse width code can comprise an analog or digital signal that is configured to specify an amount of a pulse width adjustment that a particular hybrid cell is configured to impart or apply to an input signal. In an example, the pulse width code can comprise 33 codes per cell, such as including neutral, negative and positive codes. Negative codes can indicate a reduction in desired pulse width, and positive codes can indicate an increase in desired pulse width. A zero value or midscale or neutral value code can indicate no change to the pulse width. In an example, the Hybrid Cell Control Code can further include a cell address code associated with the delay code and pulse width code, such as can be configured to indicate a particular cell from among an array of cells.

In an example, each cell in a hybrid cell deskew system can be configured to impart a minimum pulse width adjustment (e.g., zero seconds), a maximum pulse width adjustment (e.g., plus or minus 75 picoseconds), or an intermediate pulse width adjustment (e.g., between zero and plus or minus 75 picoseconds). For purposes of discussion only, 75 picoseconds is used as an example of a maximum pulse width adjustment magnitude per cell. Other maximum pulse width adjustment values can similarly be used.

In an example, each cell in a hybrid cell deskew system can be configured to impart a minimum delay (e.g., zero seconds), a maximum delay (e.g., 150 picoseconds), or an intermediate delay (e.g., between zero and 150 picoseconds). For purposes of discussion only, 150 picoseconds is used as an example of a maximum delay adjustment magnitude per cell. Other maximum delay adjustment values can similarly be used.

In an example, a preceding cell in a deskew system can be set to a maximum delay configuration before a subsequent cell can be used for delay, or a preceding cell in a deskew system can be set to a maximum pulse width adjustment before a subsequent cell can be used for pulse width adjustment. In some examples, a hybrid cell can be configured for maximum delay in order for the same cell to be configured for pulse width adjustment.

Figure 15A:
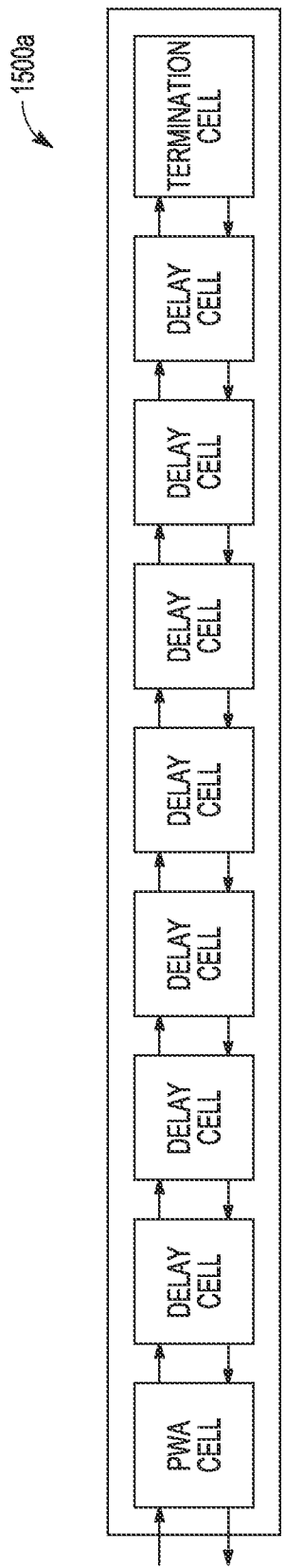
FIG. 15A illustrates generally an example of a hybrid cell deskew system.

FIG. 15A illustrates generally a first example 1500a of a deskew system. In the first example 1500a, a first cell is configured as a pulse width adjustment cell, second through seventh subsequent cells are configured as delay cells, and a ninth cell is configured as a termination cell or loop-back cell. In this example, the pulse width adjustment cell is configured to provide a delay of 150 picoseconds. In the configuration of the first example 1500a, the deskew system can be configured to delay an input signal by at least 150 picoseconds and at most 1.2 nanoseconds (e.g., corresponding to a maximum delay of 150 picoseconds at each of the eight different cells). In the first example 1500a, only one cell is configured as a pulse width adjustment cell, and therefore the deskew system can be configured to provide a pulse width adjustment of 75 picoseconds or less, such as depending on a value of the delay code.

In an example, fewer than all of the cells in the first example 1500a can be used. For example, the first cell (e.g., configured as a pulse width adjustment cell) can be used, and a second cell (e.g., configured as a delay cell) can be used. The third cell can be unused or configured as a termination cell or loop-back cell. In this example, the third through ninth cells can be partially or entirely unused and can be unpowered or minimally powered. In this example, the system can provide a pulse width adjustment of 75 picoseconds or less (e.g., using the first cell) and can provide a delay adjustment of between 150 picoseconds and 300 picoseconds (e.g., using the first and second cells).

Figure 15B:
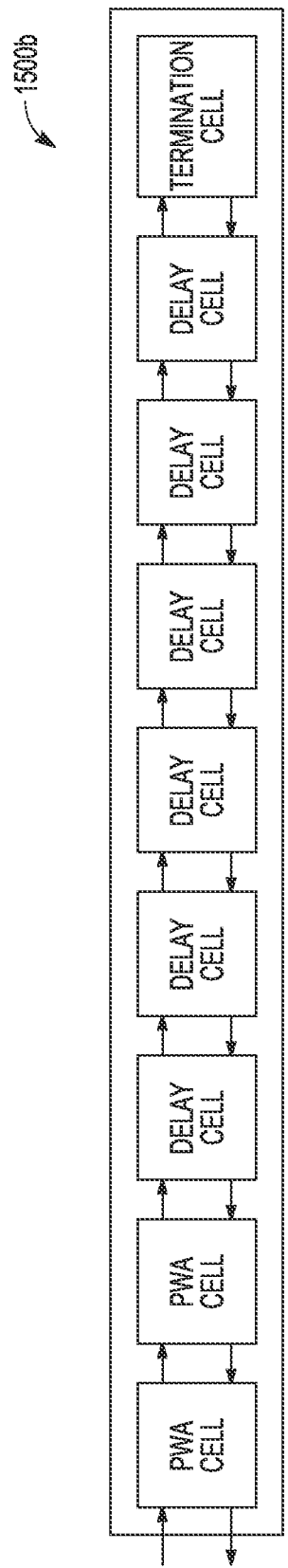
FIG. 15B illustrates generally an example of a hybrid cell deskew system.

FIG. 15B illustrates generally a second example 1500b of a deskew system. In the second example 1500b, first and second cells are configured as pulse width adjustment cells, third through seventh subsequent cells are configured as delay cells, and a ninth cell is configured as a termination cell or loop-back cell. In this example, the pulse width adjustment cells are configured to provide a delay of 300 picoseconds. In the configuration of the second example 1500b, the deskew system can be configured to delay an input signal by at least 300 picoseconds and at most 1.2 nanoseconds (e.g., corresponding to a maximum delay of 150 picoseconds at each of the eight different cells). In the second example 1500b, since two cells are configured to provide the pulse width adjustment, the total pulse width adjustment can be 150 picoseconds or less (e.g., 75 picoseconds or less at each of the first and second cells).

Figure 16:
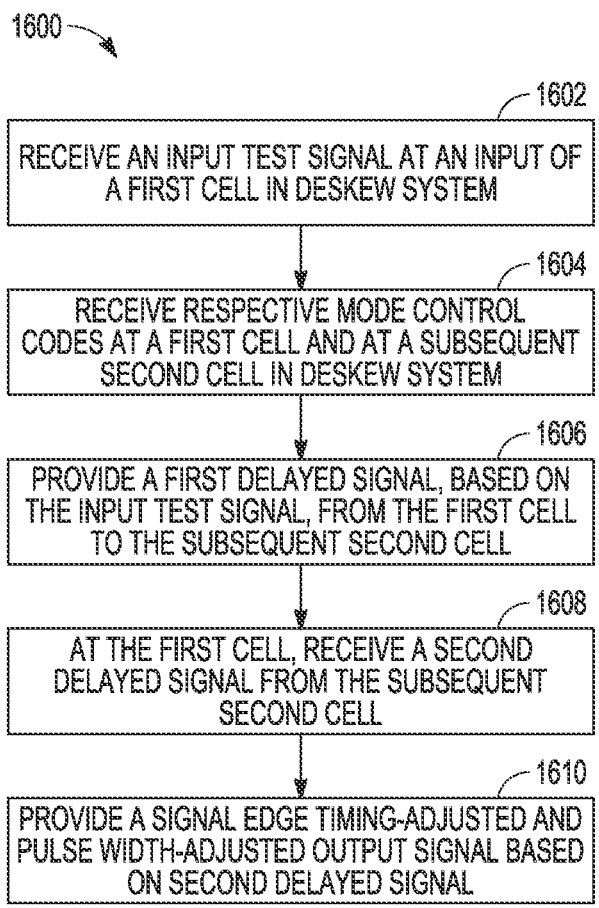
FIG. 16 illustrates generally an example of a method of using a hybrid cell deskew system.

FIG. 16 illustrates generally a method 1600 for adjusting timing of a test signal provided to a device under test using multiple, series-coupled signal timing control cells. In an example, the method 1600 can include or use a deskew system comprising one or more hybrid cells, such as using the hybrid cell deskew system 1100 from the example of FIG. 11. In an example, each of the timing control cells or hybrid cells can be configured to operate in a pulse width adjustment mode, a delay mode, or a mode in which pulse width and delay can be adjusted.

The method 1600 can include, at block 1602, receiving an input test signal at an input of a first cell in a deskew system. For example, block 1602 can include receiving a differential input signal (e.g., Q and Q-bar, or a differential voltage signal $V_{IN}$) at an input of a first hybrid cell in the hybrid cell deskew system 1100. At block 1604, the method 1600 can include receiving first and second mode control codes at first and subsequent second cells of the deskew system. The mode control codes can include, for example, respective Hybrid Cell Control Codes, or portions of a Hybrid Cell Control Code. In the example of FIG. 16, the block 1604 follows the block 1602, however, the blocks can be performed in a different order or can be performed substantially concurrently.

In an example, at block 1606, the method 1600 can include providing a first delayed signal, based on the input test signal, from the first cell to the subsequent second cell. In an example, the first delayed signal can be a delayed version of the input signal. The first delayed signal can optionally be delayed by zero seconds, corresponding to a minimum delay or no edge timing adjustment. In response to receiving the first delayed signal, the subsequent second cell can process the signal and provide a second delayed signal. The subsequent second cell can process the signal by changing a delay, pulse width, or other characteristic of the signal to provide the second delayed signal.

At block 1608, the method 1600 can include receiving, at the first cell in the deskew system, the second delayed signal from the subsequent second cell. In response to receiving the second delayed signal, the first cell can process the signal and provide a deskewed signal. The first cell can process the signal by changing at least a pulse width characteristic, and optionally a delay or other characteristic, of the signal to provide the deskewed signal. At block 1610, the method 1600 can include providing the deskewed signal as an output (e.g., as a differential output signal) from the first cell. The deskewed output signal can thus comprise a signal that corresponds to the input test signal but can have a different signal delay characteristic, and can have a different pulse width characteristic than the input test signal.

Various aspects of the present disclosure can help provide a solution to the test system-related problems identified herein. For example, delay and pulse width adjustment circuits, such as can comprise portions of the same cell in a cell-based deskew system, can be used to help compensate for mismatches in high-speed data signal paths. In some examples, the solution described herein can include or use a combination of delay and pulse width adjustment circuitry to control pulse duration and signal edge placement, and can help reduce or eliminate timing errors, for example, between multiple different signals or channels in a test system.

In an example, Aspect 1 can include or use subject matter (such as an apparatus, a system, a device, a method, a means for performing acts, or a device readable medium including instructions that, when performed by the device, can cause the device to perform acts, or an article of manufacture), such as can include a deskew system for providing test signals for a device under test. In Aspect 1, the system can include multiple timing-control cells coupled in a series, wherein each cell is operable in one of multiple different operating modes according to respective mode control signals, the different modes including a signal delay mode and a signal pulse width adjustment mode. In an example, in Aspect 1, a first cell of the multiple timing-control cells includes a first input node configured to receive a test input signal, a reverse input node configured to receive a delayed signal, based on the test input signal, from a subsequent cell in the series, a first output node configured to provide a deskew output signal, and a timing adjustment circuit configured to adjust a pulse width of at least one of the test input signal or the delayed signal to provide the deskew output signal.

Aspect 2 can include or use, or can optionally be combined with the subject matter of Aspect 1, to optionally include, in the signal pulse width adjustment mode, the first cell is configured to provide the deskew output signal, the deskew output signal having a different pulse width and a different delay characteristic than the test input signal.

Aspect 3 can include or use, or can optionally be combined with the subject matter of Aspect 2, to optionally include the first cell comprising a forward output node coupled to the subsequent cell and a reverse input node coupled to the subsequent cell, and the deskew output signal can be based on a delayed signal, received at the reverse input node, from the subsequent cell.

Aspect 4 can include or use, or can optionally be combined with the subject matter of one or any combination of Aspects 1 through 3 to optionally include a control circuit configured to provide respective first and second mode control signals to the first cell and the subsequent cell. In Aspect 4, the first cell can be configured to operate in the signal pulse width adjustment mode in response to the first mode control signal, and the subsequent cell can be configured to operate in the signal delay mode in response to the second mode control signal.

Aspect 5 can include or use, or can optionally be combined with the subject matter of Aspect 4, to optionally include or use the control circuit configured to provide a pulse width control signal to the timing adjustment circuit in the first cell to control a magnitude of a pulse width of the deskew output signal.

Aspect 6 can include or use, or can optionally be combined with the subject matter of Aspect 4, to optionally include or use the control circuit configured to provide a delay control signal to the subsequent cell to control an edge timing of the delayed signal relative to the test input signal.

Aspect 7 can include or use, or can optionally be combined with the subject matter of one or any combination of Aspects 1 through 6 to optionally include, at the first cell, an early signal input node coupled to a forward output node of a preceding cell in the series or to the first input node, a late signal input node coupled to a reverse output node of the subsequent cell in the series, a summing circuit configured to provide an intermediate signal by combining signals that are respectively modulated based on a delay control signal and respective signals at the early and late signal input nodes, and a pulse width adjustment circuit configured to provide the deskew output signal based on a pulse width control signal and the intermediate signal from the summing circuit.

Aspect 8 can include or use, or can optionally be combined with the subject matter of one or any combination of Aspects 1 through 7 to optionally include, at the first cell, a pulse width adjustment circuit configured to receive the test input signal and, in response, provide an intermediate pulse width-adjusted signal to the subsequent cell, and a late signal input node coupled to a reverse output node of the subsequent cell in the series, and a summing circuit configured to provide the deskew output signal by combining a signal received at the late signal input node and the intermediate pulse width-adjusted signal.

Aspect 9 can include or use, or can optionally be combined with the subject matter of one or any combination of Aspects 1 through 8 to optionally include, at the timing adjustment circuit, a cascode stage with an adjustable bias current source, wherein a magnitude of a current signal provided by the bias current source corresponds to a magnitude of the pulse width adjustment.

Aspect 10 can include or use, or can optionally be combined with the subject matter of one or any combination of Aspects 1 through 9 to optionally include a method for adjusting timing of a test signal provided to a device under test using multiple, series-coupled signal timing control cells wherein each of the control cells operates in one of a pulse width adjustment mode or a delay mode. In an example, Aspect 10 can include, at a first cell of the timing-control cells, receiving an input test signal at an input node of the first cell, receiving a first mode control signal, providing a first delayed signal, based on the input test signal, to a subsequent cell of the series-coupled timing-control cells, receiving a second delayed signal from the subsequent cell, and providing a pulse width-adjusted output signal based on the second delayed signal, wherein a delay characteristic and a pulse width characteristic of the output signal are based on the first mode control signal.

Aspect 11 can include or use, or can optionally be combined with the subject matter of Aspect 10, to optionally include, at the subsequent cell of the timing-control cells, receiving the first delayed signal from the first cell, receiving a second mode control signal, and providing the second delayed signal to the first cell, wherein the second delayed signal is based on the first delayed signal, and wherein a delay characteristic of the second delayed signal is based on the second mode control signal.

Aspect 12 can include or use, or can optionally be combined with the subject matter of one or any combination of Aspects 10 or 11 to optionally include receiving discrete delay control and pulse width control codes, and the delay and pulse width characteristics of the output signal are based respectively on the delay and pulse width control codes.

Aspect 13 can include or use, or can optionally be combined with the subject matter of Aspect 12, to optionally include receiving a second mode control code at the subsequent cell, and the second mode control code indicates a configuration for delay and/or pulse width adjustment circuitry in the subsequent cell.

Aspect 14 can include or use, or can optionally be combined with the subject matter of one or any combination of Aspects 10 through 13 to optionally include changing a magnitude of a current signal provided by a bias current source in the subsequent cell. Delay or pulse width characteristics of the second delayed signal can depend at least in part on the magnitude of the current signal provided by the bias current source.

Aspect 15 can include or use, or can optionally be combined with the subject matter of one or any combination of Aspects 10 through 14 to optionally include updating, based on a delay instruction in the first mode control signal, a first bias current magnitude for a first differential pair in a reverse signal path extending from the subsequent cell to an output node of the first cell.

Aspect 16 can include or use, or can optionally be combined with the subject matter of Aspect 15, to optionally include updating, based on a pulse width instruction in the first mode control signal, a bias current magnitude for a cascode circuit in a forward signal path of the first cell, the forward signal path extending between the input node of the first cell and an input node of the subsequent cell.

Aspect 17 can include or use, or can optionally be combined with the subject matter of Aspect 15, to optionally include updating, based on a pulse width instruction in the first mode control signal, a bias current magnitude for a second differential pair of switches in the reverse signal path.

Aspect 18 can include or use, or can optionally be combined with the subject matter of one or any combination of Aspects 1 through 17 to optionally include a system for changing a signal delay or pulse width characteristic of test signals provided to a device under test. In Aspect 18, the system can include multiple timing control cells coupled in a series, wherein a first cell of the multiple timing control cells includes a first input node and a first output node, and the first cell is configured to delay and adjust a pulse width of an input signal received at the first input node. In Aspect 18, the first cell can include an early signal input node coupled to a forward output node of a preceding cell in the series or to the first input node, and a late signal input node coupled to a reverse output node of a subsequent cell in the series, and a summing circuit configured to provide an intermediate signal by combining signals that are modulated based on a delay adjustment instruction and respective data signals at the early and late signal input nodes, and a pulse width adjustment circuit configured to provide a pulse width-adjusted output signal at the first output node based on a pulse width adjustment instruction and the intermediate signal from the summing circuit.

Aspect 19 can include or use, or can optionally be combined with the subject matter of Aspect 18, to optionally include the delay adjustment instruction indicating a delay amount to be applied, relative to the input signal, using the first cell, and the pulse width adjustment instruction can indicate a magnitude of a pulse width change to be applied, relative to a pulse width of the input signal, using the first cell.

Aspect 20 can include or use, or can optionally be combined with the subject matter of one or any combination of Aspects 18 or 19 to optionally include the subsequent cell configured to provide a late data signal at the late signal input node of the first cell, the late data signal corresponding to a time-delayed version of the input signal, and the first cell can be configured to provide the pulse width-adjusted output signal as a pulse width-adjusted and further time-delayed version of the input signal.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A deskew system for providing test signals for a device under test, the system comprising:
   multiple timing-control cells coupled in a series, wherein each cell is operable in one of multiple different operating modes according to respective mode control signals, the different modes including a signal delay mode and a signal pulse width adjustment mode, wherein a first cell of the multiple timing-control cells includes:
   a first input node configured to receive a test input signal;
   a reverse input node configured to receive a delayed signal, based on the test input signal, from a subsequent cell in the series;
   a first output node configured to provide a deskew output signal; and
   a timing adjustment circuit configured to adjust a pulse width of at least one of the test input signal or the delayed signal to provide the deskew output signal.

2. The system of claim 1, wherein in the signal pulse width adjustment mode, the first cell is configured to provide the deskew output signal, the deskew output signal having a different pulse width and a different delay characteristic than the test input signal.

3. The system of claim 2, wherein the first cell comprises a forward output node coupled to the subsequent cell and a reverse input node coupled to the subsequent cell, and wherein the deskew output signal is based on a delayed signal, received at the reverse input node, from the subsequent cell.

4. The system of claim 1, further comprising a control circuit configured to provide respective first and second mode control signals to the first cell and the subsequent cell, wherein the first cell is configured to operate in the signal pulse width adjustment mode in response to the first mode control signal, and wherein the subsequent cell is configured to operate in the signal delay mode in response to the second mode control signal.

5. The system of claim 4, wherein the control circuit is configured to provide a pulse width control signal to the timing adjustment circuit in the first cell to control a magnitude of a pulse width of the deskew output signal.

6. The system of claim 4, wherein the control circuit is configured to provide a delay control signal to the subsequent cell to control an edge timing of the delayed signal relative to the test input signal.

7. The system of claim 1, wherein the first cell includes:
an early signal input node coupled to a forward output node of a preceding cell in the series or to the first input node;
a late signal input node coupled to a reverse output node of the subsequent cell in the series;
a summing circuit configured to provide an intermediate signal by combining signals that are respectively modulated based on a delay control signal and respective signals at the early and late signal input nodes; and
a pulse width adjustment circuit configured to provide the deskew output signal based on a pulse width control signal and the intermediate signal from the summing circuit.

8. The system of claim 1, wherein the first cell includes:
a pulse width adjustment circuit configured to receive the test input signal and, in response, provide an intermediate pulse width-adjusted signal to the subsequent cell;
a late signal input node coupled to a reverse output node of the subsequent cell in the series; and
a summing circuit configured to provide the deskew output signal by combining a signal received at the late signal input node and the intermediate pulse width-adjusted signal.

9. The system of claim 1, wherein the timing adjustment circuit comprises a cascode stage with an adjustable bias current source, wherein a magnitude of a current signal provided by the bias current source corresponds to a magnitude of the pulse width adjustment.

10. A method for adjusting timing of a test signal provided to a device under test using multiple, series-coupled signal timing control cells wherein each of the control cells operates in one of a pulse width adjustment mode or a delay mode, the method comprising:
at a first cell of the timing-control cells:
receiving an input test signal at an input node of the first cell;
receiving a first mode control signal;
providing a first delayed signal, based on the input test signal, to
a subsequent cell of the series-coupled timing-control cells;
receiving a second delayed signal from the subsequent cell; and
providing a pulse width-adjusted output signal based on the second delayed signal, wherein a delay characteristic and a pulse width characteristic of the output signal are based on the first mode control signal.

11. The method of claim 10, further comprising:
at the subsequent cell of the timing-control cells:
receiving the first delayed signal from the first cell;
receiving a second mode control signal; and
providing the second delayed signal to the first cell, wherein the second delayed signal is based on the first delayed signal, and wherein a delay characteristic of the second delayed signal is based on the second mode control signal.

12. The method of claim 10, wherein receiving the first mode control signal includes receiving discrete delay control and pulse width control codes, and wherein the delay and pulse width characteristics of the output signal are based respectively on the delay and pulse width control codes.

13. The method of claim 12, further comprising receiving a second mode control code at the subsequent cell, wherein the second mode control code indicates a configuration for delay and/or pulse width adjustment circuitry in the subsequent cell.

14. The method of claim 10, further comprising changing a magnitude of a current signal provided by a bias current source in the subsequent cell, wherein delay or pulse width characteristics of the second delayed signal depend at least in part on the magnitude of the current signal provided by the bias current source.

15. The method of claim 10, further comprising updating, based on a delay instruction in the first mode control signal, a first bias current magnitude for a first differential pair in a reverse signal path extending from the subsequent cell to an output node of the first cell.

16. The method of claim 15, further comprising updating, based on a pulse width instruction in the first mode control signal, a bias current magnitude for a cascode circuit in a forward signal path of the first cell, the forward signal path extending between the input node of the first cell and an input node of the subsequent cell.

17. The method of claim 15, further comprising updating, based on a pulse width instruction in the first mode control signal, a bias current magnitude for a second differential pair of switches in the reverse signal path.

18. A system for changing a signal delay or pulse width characteristic of test signals provided to a device under test, the system comprising:
multiple timing control cells coupled in a series, wherein a first cell of the multiple timing control cells includes a first input node and a first output node, and the first cell is configured to delay and adjust a pulse width of an input signal received at the first input node, and wherein the first cell includes:
an early signal input node coupled to a forward output node of a preceding cell in the series or to the first input node;
a late signal input node coupled to a reverse output node of a subsequent cell in the series;
a summing circuit configured to provide an intermediate signal by combining signals that are modulated based on a delay adjustment instruction and respective data signals at the early and late signal input nodes; and
a pulse width adjustment circuit configured to provide a pulse width-adjusted output signal at the first output node based on a pulse width adjustment instruction and the intermediate signal from the summing circuit.

19. The system of claim 18, wherein the delay adjustment instruction indicates a delay amount to be applied, relative to the input signal, using the first cell, and wherein the pulse width adjustment instruction indicates a magnitude of a pulse width change to be applied, relative to a pulse width of the input signal, using the first cell.

20. The system of claim 18, wherein the subsequent cell is configured to provide a late data signal at the late signal input node of the first cell, the late data signal corresponding to a time-delayed version of the input signal, and wherein the first cell is configured to provide the pulse width-adjusted output signal as a pulse width-adjusted and further time-delayed version of the input signal.

* * * * *